US010738375B2

(12) United States Patent
Ali et al.

(10) Patent No.: US 10,738,375 B2
(45) Date of Patent: Aug. 11, 2020

(54) HARD THIN FILMS

(71) Applicant: HPVico AB, Vaxio (SE)

(72) Inventors: Sharafat Ali, Vaxjo (SE); Bo Jonson, Vaxjo (SE); Jens Birch, Linkoping (SE); Per Eklund, Linkoping (SE)

(73) Assignee: HPVICO AB, Vaxio (SE)

( * ) Notice: Subject to any disclaimer, the term of this patent is extended or adjusted under 35 U.S.C. 154(b) by 89 days.

(21) Appl. No.: 15/351,496

(22) Filed: Nov. 15, 2016

(65) Prior Publication Data

US 2018/0135159 A1     May 17, 2018

(51) Int. Cl.

| | |
|---|---|
| *H01L 21/02* | (2006.01) |
| *C23C 14/00* | (2006.01) |
| *C23C 14/06* | (2006.01) |
| *C23C 14/50* | (2006.01) |
| *C23C 14/34* | (2006.01) |

(52) U.S. Cl.
CPC ...... *C23C 14/0036* (2013.01); *C23C 14/0676* (2013.01); *C23C 14/3464* (2013.01); *C23C 14/505* (2013.01)

(58) Field of Classification Search
CPC ....... H01L 21/70; H01L 21/02; H01L 21/336; H01L 29/51; H01L 21/28; H01L 29/40; H01L 21/8247; H01L 27/105; H01L 21/0124; H01L 21/02142; H01L 21/02156; H01L 21/20161; C23C 14/0036; C23C 16/308
See application file for complete search history.

(56) References Cited

U.S. PATENT DOCUMENTS

| | | | |
|---|---|---|---|
| 4,496,450 A | 1/1985 | Hitotsuyanagi et al. | |
| 5,374,318 A | 12/1994 | Rabalais et al. | |
| 5,846,649 A | 12/1998 | Knapp et al. | |
| 6,083,313 A | 7/2000 | Venkatraman et al. | |
| 6,299,294 B1 * | 10/2001 | Regan | B41J 2/14129 347/62 |
| 6,447,891 B1 | 9/2002 | Veersamy et al. | |
| 6,572,935 B1 | 6/2003 | He et al. | |
| 7,108,747 B1 | 9/2006 | Leskelä et al. | |
| 8,097,330 B2 | 1/2012 | Nashiki et al. | |
| 2011/0236674 A1 | 9/2011 | Aiba | |
| 2016/0111684 A1 | 4/2016 | Savas et al. | |

FOREIGN PATENT DOCUMENTS

| | | | |
|---|---|---|---|
| CN | 103880432 A | * | 6/2014 |
| WO | WO 2014/0182640 A1 | | 11/2014 |
| WO | WO 2015/038835 A1 | | 3/2015 |

OTHER PUBLICATIONS

Machine translation of CN 103880432 A.*
PCT/IB2016/056863, Ali, S., Hard Thin Films, Nov. 16, 2016.
"Novel transparent Mg—Si—O—N thin films with high hardness and refractive index." Ali, S. et al., Vacuum 131 (2016) pp. 1-4.
"Preparation, characterization and properties of nitrogen rich glasses in alkaline earth-Si—O—N systems," Ali, S., Doctoral Thesis, Department of Physical, Inorganic and Structural Chemistry, Stockholm University, 2009.
"Compositional effects on the properties of high nitrogen content alkaline-earth silicon oxynitride glasses, AE=Mg, Ca, Sr, Ba," Ali, S. and Jonson, B., Journ. Eur. Ceram. Soc., 31 (2011) pp. 611-618.
PCT Written Opinion for copending application PCT/IB2016/056863.
PCT International Search Report for copending application PCT/IB2016/056863.

* cited by examiner

*Primary Examiner* — Haidung D Nguyen
(74) *Attorney, Agent, or Firm* — Moser Taboada

(57) ABSTRACT

Systems and methods provide for the improvement of surface properties via deposition of a film. A typical film may comprise at least three, including at least four components, and typically includes at least one of, including both of, Nitrogen and Oxygen. A film may include at least one of Silicon, Phosphorous, and Boron, and one or more modifiers. For some films, a modifier may include an element having a cationic field strength greater than 10 Å^-2. A film may have a high hardness and/or modulus. A film, may be substantially transparent to visible light. Some films have high refractive indices. Some films have low refractive indices. Some films have very low ultraviolet extinction coefficients.

20 Claims, 15 Drawing Sheets

_US 10,738,375 B2_

HARD THIN FILMS

The present description is related to PCT application no. PCT/IB2016/056863, filed Nov. 15, 2016.

BACKGROUND

1. Technical Field

The present invention relates generally to protective films having improved combinations of properties, and particularly to hard films that are at least partially transparent to light, such as visible light.

2. Description of Related Art

Many materials provide a desired combination of bulk properties, but suffer from insufficient surface properties. To mitigate these deficiencies, a protective film may be deposited on a material to enhance a material's properties, particularly those properties dependent upon or proximate to the surface of the material. A film may increase hardness, reduce wear, improve resistance to environmental degradation, protect the surface from radiation, provide communicative access to the surface, change the appearance of the surface, modify reflectivity of the surface, and/or provide a variety of other effects.

Some materials benefit from a surface having increased hardness, modulus, wear resistance, strength, and/or toughness. In some cases, bulk material properties that are optimized to fulfill certain bulk requirements require the improvement of surface properties. This improvement may be effected via the deposition of a film.

Some films need to meet a diverse range of requirements. A film deposited on a surface should generally adhere to the surface. A film that protects a surface from wear should not chemically degrade the surface. A protective film on a transparent article (e.g., a window, a display screen, and the like) should not degrade the optical performance of that article. Typically, films having high hardness are not particularly transparent, and vice versa. As such, protecting optical components may require a film having an unusual combination of mechanical and optical properties.

There is an increasing demand for improved transparent materials, such as glasses with better mechanical and optical properties for display and electronic applications. Many hard coatings are not transparent, and many transparent coatings are not hard, but some materials would benefit from a film combining hardness and transparency. Portable computing devices such as mobile phones, tablets, and the like have displays that are often exposed to abrasion and/or weather, and so might benefit from a coating that protects the display while still providing requisite optical properties. Windows typically spend decades exposed to the environment, which may, especially in humid environments, entail a wide range of chemical and physical degradation processes (rain, dust, abrasion, bird droppings, cleaning fluids, scrubbing, stone chipping, and the like). A protective window coating should generally not degrade the optical properties of the window (even over decades of life) yet still improve certain properties that insufficient in the bulk window material (e.g., soda-lime glass, silicon, GaAs).

Sometimes, an optimization of a material's properties requires an understanding of the effect of changes in experimental conditions on the resultant material properties. An improved understanding of the relationship between these relationships between input conditions to make a material and the corresponding effects in material properties may improve the efficiency with which new materials are developed. It may be advantageous to identify a set of controllable parameters that yield a desired range of properties.

SUMMARY OF THE INVENTION

Various aspects provide for a multicomponent thin film deposited on a substrate, typically via deposition of at least three elements. In some cases, reactive sputtering of elemental targets in the presence of a reactive atmosphere can be used to deposit a multicomponent oxynitride film. One or more experimental control parameters associated with film composition and/or microstructure may be adjusted to effect a change in the resulting film's properties. A film may comprise an advantageous combination of mechanical, optical, and/or chemical properties. A film may combine high hardness, modulus, and/or wear resistance with high transparency, a desirable band gap, and/or a certain complex refractive index.

In some embodiments, a film comprises at least four elements. The four elements may include a matrix and at least one modifier element, typically having a cation field strength (CFS) chosen to enhance one or more desired properties. In some films, increasing modifier CFS may increase hardness, wear resistance, and/or oxidation resistance. In some films, CFS may be controlled to engineer a desired residual stress in the film. CFS may be controlled to improve optical properties of some films.

A film may comprise Oxygen, Nitrogen, at least one of Silicon, Phosphorous, and Boron, and at least one modifier element. A modifier element may have a CFS that is at least 1 and not greater than 13 $\text{Å}^{-2}$. A modifier element may have a CFS that is at least 2 and not greater than 5.5 $\text{Å}^{-2}$. A modifier element may have a CFS that is greater than 10 $\text{Å}^{-2}$. A modifier element may have a CFS that is below 1 $\text{Å}^{-2}$.

In some embodiments, a modifier element comprises one or more of Magnesium, Calcium, Strontium, Barium, Yttrium, Praseodymium, Scandium, Cerium, Lanthanum, Aluminum, Titanium, Niobium, Samarium, Neodymium, Promethium, Tantalum, Gallium and Zirconium.

A film may have a refractive index between 450 and 1200 nm that does not exceed 1.8, particularly below 1.65, including below 1.62. A film may have a refractive index that is at least 1.45, particularly at least 1.5. A refractive index between 450 and 1200 nm may be between about 1.5 and 1.62. A film may have a hardness that is at least 8 GPa, particularly at least 9 GPa, particularly not above 15 GPa for certain films. A film may have a hardness between 2 and 16 GPa. A film may have a band gap that is at least 3 eV, including at least 3.25 eV, and particularly not greater than 5.25 eV, particularly between 3.5 and 4.5 eV. A film may have a hardness that is at least 2 GPa, particularly not greater than 14 GPa. A film may have a refractive index at 633 nm that is not greater than 1.95, including not greater than 1.85, including at least 1.45. A film may have a band gap that is at least 3.25 eV, including at least 4 eV. A film may have a band gap that is not greater than 5.25 eV, including not greater than 5 eV. A film may have a refractive index at 633 nm that is at least 1.5, including at least 1.55, particularly not greater than 1.85. A film may have an extinction coefficient at 233 nm that does not exceed 0.1, particularly does not exceed 0.06, particularly does not exceed 0.04. A film may have an extinction coefficient at 233 nm that does not exceed 0.01, particularly does not exceed 0.005. A film may have a reduced elastic modulus by nanoindentation that is at least 40 GPa, particularly not greater than 120 GPa, including below about 90 GPa. A film may have a reduced elastic modulus between about 50 and 80 GPa.

In atomic %, the at least one of Silicon, Phosphorous and Boron may be present in an amount that is at least 4% and not greater than 60%, including about 10-50%, including 18-35%, including 20-33%, including up to about 26%. The Nitrogen may be present in an amount that at least 10% and not greater than 70%, particularly about 15-60%, including 26-49%, including 28-47%, including up to about 34%. The Oxygen may be present in an amount that is at least 3% and not greater than 60%, including about 5-50%, including 6-34%, including about 8-30%, including about 24-30%.

A modifier element may be present in an amount that is at least 0.1% and not greater than 50%, including about 5-45%, including about 7 to 40%, including about 14-30%, including 7-24%, including 14-22%. A modifier element may be present in an amount that is at least 16% and not greater than 26%. In a particular embodiment, the at least one of Silicon, Phosphorous, and Boron (e.g., Silicon) is at least 20% and not greater than 26%, the Nitrogen is at least 28% and not greater than 34%, the Oxygen is at least 24% and not greater than 30%, and at least one modifier and/or a sum of the modifiers (e.g., Magnesium and/or another element with similar CFS) is at least 15% and not greater than 26%.

A film may have an aggregate amount of (Nitrogen+Oxygen), in atomic %, that is at least 48% and not greater than 62%. A film may have a ratio of Nitrogen to (Nitrogen+Oxygen) that is at least 0.4, particularly not greater than 0.9, including below about 0.86. A ratio of an amount of one (or more) modifier(s) to an aggregate amount of (the modifier(s)+Silicon) may be at least 0.23 and not greater than 0.51. In an embodiment, a modifier element comprises at least one of an alkaline earth and a rare earth, and a ratio of Nitrogen to (Nitrogen+Oxygen) is at least 0.4 and not greater than 0.9, including not greater than 0.86. In some cases, a ratio of an amount of one or more of the alkaline earth(s) and/or rare earth(s) to an aggregate amount of (the alkaline earth(s) and/or rare earth(s)+Silicon) is between 0.3 and 0.5. A film may have a hardness that is at least 2 GPa, particularly at least 9 GPa, and an extinction coefficient at 233 nm that does not exceed 0.1, particularly does not exceed 0.05. In some films, a ratio of Nitrogen to (Nitrogen+Oxygen) is at least 0.3 and not greater than 0.85. A ratio of modifier element to (modifier element+Silicon) may be at least 0.25 and not greater than 0.5.

A film may have a nanoindentation hardness above 2 GPa, including at least 9 GPa, including at least 14 GPa, including up to 25 GPa, including about 15-22 GPa, including 17-21 GPa. A film may have a reduced elastic modulus that is at least 50 GPa, including at least 120 GPa. A film may have a reduced elastic modulus that is at least 120 GPa, including up to about 180 GPa, including at least 130 and not greater than 170 GPa. A film may combine high hardness with low extinction coefficient. For example, a film may have an extinction coefficient at 233 nm that does not exceed 0.15 particularly does not exceed 0.1, particularly does not exceed 0.08, particularly does not exceed 0.05, particularly does not exceed 0.025.

A film may be substantially amorphous, substantially crystalline, or a combination of amorphous and crystalline phases (e.g., as measured by x-ray diffraction using Cu kα radiation). A diffractogram of a film may comprise a crystalline peak and/or an amorphous hump. In some films, a highest peak has a maximum peak height, the hump has a hump height, and the hump height is at least 10%, including at least 80%, including at least 90%, of the height of the maximum peak height. The diffractogram of a film may show only an amorphous hump in some embodiments.

A film may be at least partially transparent to visible light. A film may have a refractive index over 600 to 1600 nanometers that is at least 1.8 and particularly up to about 2.1. A film may have a refractive index at 633 nm that is at least 1.5, including at least 1.8, particularly up to about 2.1, including between about 1.55 and 2.05, including between about 1.8 and 2.00.

A film may have a band gap that is at least 3 eV. A film may have a band gap that does not exceed 5.5 eV, including from about 3.25 to 5.25 eV. A film may have an extinction coefficient at 233 nm (e.g., as measured by Spectroscopic Ellipsometry) that does not exceed 0.15, including below 0.12, particularly below 0.1, including below 0.05, including between about 0.0005 and 0.100.

A method may comprise providing one or more targets (e.g., comprising Silicon, Boron, Phosphorous, and/or a modifier element) to a deposition chamber, particularly a vacuum chamber having a base pressure below 1E-5 torr, including below 1E-6 torr, including below 1E-7 torr. According to target composition, the method may comprise flowing an atmosphere through the chamber (e.g., comprising a Nitrogen source such as N2 and/or an Oxygen source such as O2), and depositing a film comprising the target(s) onto a substrate, including a film that incorporates at least a portion of target(s) with at least a portion of the atmospheric species. A deposition pressure may be between 1E-3 and 10E-3 torr. In an embodiment, reactive Physical Vapor Deposition (PVD) such as radio frequency and/or direct current sputtering is used to deposit the films. Deposition may include reactive deposition (e.g., between the target species and the atmospheric species). Reactive deposition may include gas phase reactions, surface reactions, and/or solid state reactions (e.g., among species deposited onto the substrate).

A film may be synthesized via sputtering, such as reactive sputtering. In some embodiments, a sputtering atmosphere may comprise Nitrogen and Oxygen (typically with Argon). A first target mounted in a first sputtering gun and a second target mounted in a second sputtering gun may be deposited simultaneously on a target that alternately faces one target or the other. A substrate may be mounted on a rotating platform (e.g., disc or cylinder) that spins the substrate fast enough that the deposited components mix together. In some cases, a substrate is heated to facilitate mixing and reacting of the deposited species. In an exemplary setup, Magnesium and Silicon are simultaneously sputtered in an atmosphere comprising Nitrogen and Oxygen to create a Magnesium-Silicon-Oxynitride film.

DETAILED DESCRIPTION OF THE INVENTION

Figure 1:
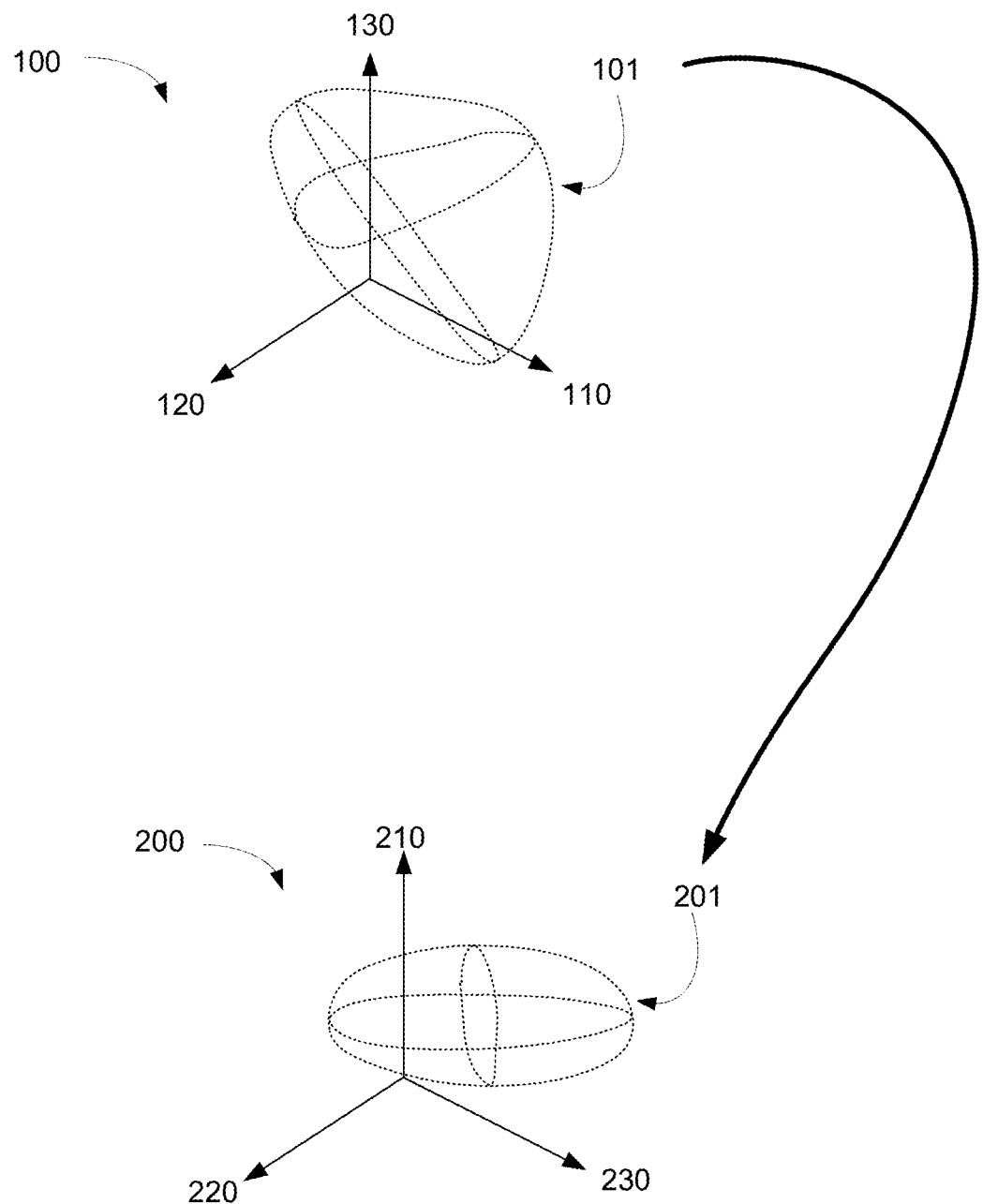
FIG. 1 schematically illustrates an exemplary mapping between thin film synthesis parameters and materials properties.

Systems and methods provide for multicomponent thin films having a range of improved properties. A typical film may have a thickness between 10 nm and 10 microns, including 100 nm to 1000 nm. A film may be deposited by Physical Vapor Deposition (PVD), including by sputtering, such as reactive sputtering. DC and/or RF magnetron sputtering may provide for compositional control of a range of components, stoichiometry, and/or microstructure. For some films, sputtering may reduce and/or eliminate the incorporation of Hydrogen, which may improve certain properties. In some cases, composition may be controlled by combining deposition rates of different elements with a reactive ambient during deposition. For PVD, target power during sputtering (e.g., higher power yielding increased amount of that material) and an appropriate atmospheric composition (typically at base pressures below 1E-5 torr and deposition pressures between 1E-3 and 1E-2 torr) may be varied to yield a range of films having different properties. Sputtering may be used to increase Nitrogen concentration to levels far higher than typically available in bulk materials, which may be advantageous. Sputtering may be used to create amorphous films having a large ratio of modifier to network forming elements (e.g., Silicon/Boron/Phosphorous) as compared to bulk materials. A modifier to network former ratio may be at least 1.5, at least 1.8, at least 2.0, at least 2.2 or even at least 2.5. By combining different materials at certain ratios, a desired microstructure may be "imposed" on the film via a combination of physical (e.g., quenching) and/or chemical "frustration," yielding film properties that deviate from bulk properties.

In some cases, a composition may be tailored to a desired combination of properties, such as hardness, toughness, strength, wear resistance modulus, transparency, roughness, adhesion, surface state (e.g., wettability), optical response, scattering, presence of inclusions (or not), inclusion size, and the like. A ratio of nitrogen to oxygen, a number of modifier elements, a cationic field strength of one or more elements, a ratio of 2+ to 3+ to 4+ cations, a ratio of another cation to silicon/boron/phosphorous, and/or other ratios may be created via an appropriate combination of synthesis conditions (e.g., sputter target power, gas phase, pressure, substrate temperature).

A typical film may comprise at least three, and typically at least four components. A film may comprise one or more substantially anionic elements such as Oxygen, and particularly at least one that forms bonds having a combination of covalent and ionic character. In some embodiments, a film comprises at least four elements. The four elements may include Nitrogen, Oxygen, and at least one element having a cationic field strength (CFS) greater than 10 Å^-2. A film may comprise a network former, such as Silicon, Boron, and/or Phosphorous. In some cases a network former may comprise an element having a cationic field strength (CFS) above 10 inverse square Angstroms. A film may comprise Aluminum (e.g., as an oxynitride).

A film may comprise one or more modifier elements. A modifier may comprise an element having CFS greater than 10 Å^-2. Typically, a modifier comprises an element having a CFS greater than 1 Å^-2, and typically below 13 Å^-2 (e.g., about 2-5.5, including 2-5). A modifier may comprise an element having a CFS less than 10 Å^-2 A modifier may comprise an alkaline earth, a rare earth, a transition metal. A modifier may include one or more group III, group IV, group V, and/or group VI elements.

Certain films may have high hardness, high modulus, and/or be relatively transparent to visible light. Some films are both hard and transparent, which may be advantageous for optical applications for which wear protection is desired (e.g., display devices that sit in a pocket or purse, or windows). A film may have a high refractive index. A film may have a low refractive index. Some films have very low extinction coefficients, particularly to ultraviolet light.

An exemplary film may comprise one or more cations, typically a 2+, 3+, and/or 4+ cation (e.g., an alkaline earth, a rare earth, and the like), silicon, and oxygen and/or nitrogen. A film may comprise an oxynitride, such as silicon oxynitride, boron oxynitride, and phosphorous oxynitride. Certain structures or stabilized or destabilized by cation choice, particularly when the cation does not readily take another valences state than its normal valence (e.g., 2+ for an alkaline earth element, 3+ for certain elements).

Chemical composition may be described in terms of atomic percent and/or equivalent %. An equivalent % may "weight" the atomic percent of an element by its valence state, and may be used to compositionally characterize the relative amounts of cations (having different valence states) and/or anions (having different valence states). For example, in an oxynitride film, N (e/o)=3*(N atomic %)/(3*(N atomic %)+2*(O atomic %)) and O (e/o)=2*(O atomic %)/(3*(N atomic %)+2*(O atomic %)). For example, in a film having both Mg and Si, Mg (e/o)=2*(Mg atomic %)/(2*(Mg atomic %)+4*(Si atomic %)) and Si (e/o)=4*(Si atomic %)/(2*(Mg atomic %)+4*(Si atomic %)).

A film may comprise Oxygen, Nitrogen, at least one of Silicon, Phosphorous, and Boron, and at least one modifier element. A modifier element may have a CFS that is greater than 10 Å$^{-2}$. A modifier element may have a CFS that is below 1 Å$^{-2}$. A modifier element may have a CFS that is at least 1 and not greater than 13 Å$^{-2}$. A modifier element may have a CFS that is at least 2 and not greater than 5.5 Å$^{-2}$ including between 2.5 and 5 Å$^{-2}$. A modifier may have a CFS that is between about 7 and 14 Å$^{-2}$. A modifier element may comprise one or more of Magnesium, Calcium, Strontium, Barium, Yttrium, Praseodymium, Cerium, Scandium, Lanthanum, Neodymium, Aluminum, Titanium, Niobium, Tantalum, Gallium and Zirconium. A modifier element may be present in an amount that is at least 0.1% and not greater than 50%, including about 5-45%, including about 7 to 40%, including about 14-30%, including 7-24%, including 14-22%. A modifier element may be present in an amount that is at least 16% and not greater than 26%.

In atomic %, the at least one of Silicon, Phosphorous and Boron may be present in an amount that is at least 4% and not greater than 60%. The Nitrogen may be present in an amount that at least 10% and not greater than 70%. The Oxygen may be present in an amount that is at least 3% and not greater than 60%.

In a particular embodiment, the at least one of Silicon, Phosphorous, and Boron (e.g., Silicon) is at least 20% and not greater than 26%, the Nitrogen is at least 28% and not greater than 34%, the Oxygen is at least 24% and not greater than 30%, and at least one modifier and/or a sum of the modifiers (e.g., Magnesium and/or another element with similar CFS) is at least 15% and not greater than 26%.

In some embodiments, a film has one or more alkaline earth elements (e.g., Mg) in atomic % is between 5 and 35%, including between about 10 and 22%, particularly at least 11% and at most 21%, including at least 16% and at most 20%. A silicon concentration may be at least 20% and at most 35%, including at least 22% and at most 32%. A concentration of Oxygen may be at least 10% and at most 30%. A concentration of Nitrogen may be at least 25% and at most 49%, particularly at least 30% and at most 45%. In some films, an amount of (Nitrogen+Oxygen) is at least 50% and at most 54%, including at least 52% and at most 62%, including at least 54% and at most 60%, including at least 57% and at most 59%.

FIG. 1 schematically illustrates an exemplary mapping between thin film synthesis parameters and materials properties. An experimental parameter space 100 may comprise controllable input conditions that may be varied to change film properties. A first parameter 110 may describe certain reference properties of elements to be incorporated into the film. Valence state, iconicity vs. covalency of bonding, preferred size, cationic field strength, and other factors may be used to characterize different elements. A second parameter 120 may describe various chemical controls used during thin film synthesis, such as gas flow rate(s), target power, substrate bias, system pressure, and the like. A third parameter 130 may describe various thermal and/or physical parameters associated with deposition and/or treatment. Substrate temperature, annealing protocol, quenching protocol, and the like may be used to enhance or minimize certain reactions at or after deposition. Fewer or additional parameters may be used to define a parameter space.

A range of experimental conditions in parameter space 100 may be used to define a volume 101 of different values for these conditions. Volume 101 may result in films having a range of properties. These properties may be mapped in a property space 200. A property space 200 may have its own dimensionality. For example, a dimension 210 may correspond to mechanical properties (e.g., hardness, elastic modulus, wear resistance, toughness, and the like). A dimension 220 may correspond to optical properties (band gap, complex refractive index, transparency, absorption, and the like). A dimension 230 may correspond to chemical properties, such as oxidation resistance, corrosion resistance, wettability surface tension, and the like.

In some embodiments, a volume 101 of control parameters may map to a corresponding volume 201 of property values. Typically, volumes 101 and 201 have different sizes and shapes. By appropriately varying control parameters, films having a range of properties and/or combinations of properties may be synthesized.

Figure 2:
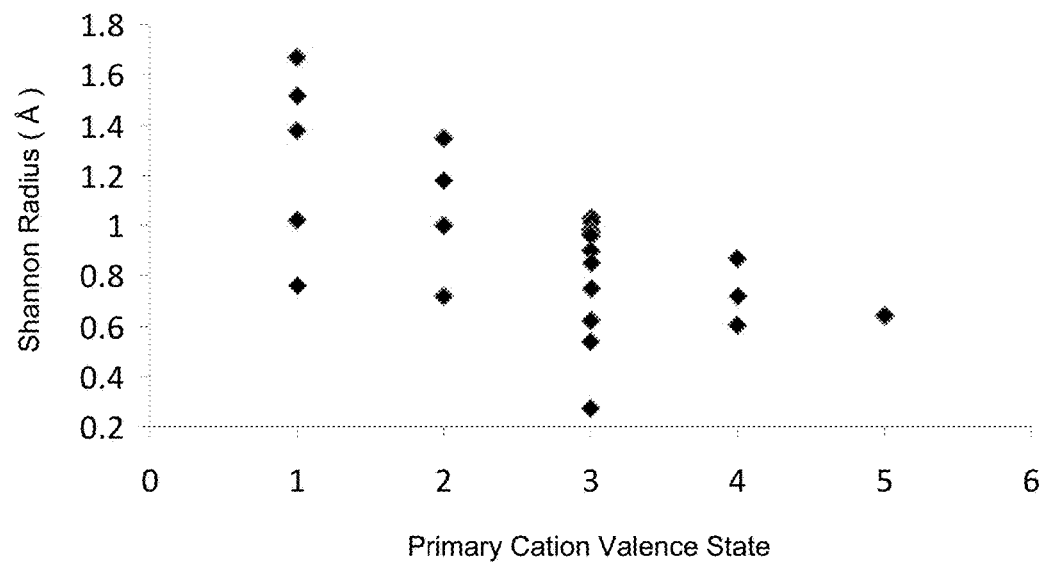
FIG. 2 illustrates an elemental representation, according to some embodiments.

FIG. 2 illustrates an elemental representation, according to some embodiments. For some films, an estimate of an element's size and its preferred or likely valence state may be used to choose elements likely to impart desired properties to the film. Valence state may vary, but is often relatively well known, particularly for elements that do not tend to adopt different valence states (e.g., transition metals). Ionic size typically varies according to the coordination of the ion, which typically depends upon its surrounding elements. Historical data regarding the preferred coordination and sizes of various ions have been accumulated. A common reference set of "Shannon radii" may describe a radius derived by Shannon and Prewitt, and is often used (e.g., R. D. Shannon (1976) "Revised effective ionic radii and systematic studies of interatomic distances in halides and chalcogenides" Acta Crystallogr A. 32: 751-767, incorporated by reference herein) such that the reference for ionic size may be incorporated into the description of size. Other radii estimates may be used. While these data are estimates, they may still provide useful guidance toward the choice of an element used to modify a film.

In some embodiments, cationic field strength (CFS) may be used to choose a modifier. CFS may characterize the "intensity" of the localized field created by an ion on its surrounding elements; its "strength to impose on its neighbors" so to speak. In some cases, an expected effect (based on CFS) may depend upon the matrix into which the corresponding element is inserted. In some cases, the expected effect (based on CFS) may be largely independent of the surrounding matrix. CFS may describe the relative tendency of an element to behave as a network former, network modifier, and/or combination thereof.

CFS may be calculated using estimates of the preferred valence state of an ion and an estimate of its preferred size. Table 1 lists CFS for several elements, using preferred valence states and Shannon Radii. In this illustrative example, only one multivalent cation is shown for illustration (Cerium as both 3+ and 4+). Other valence states, other elements, and other radii may be used.

TABLE 1

| (Cationic Field Strength based on Shannon-Prewitt Radii) | |
| --- | --- |
| Element | CFS: Z/r2 unit Å–2 |
| Cs 1+ | 0.359 |
| Rb 1+ | 0.433 |
| K 1+ | 0.525 |
| Na 1+ | 0.961 |
| Ba 2+ | 1.097 |
| Sr 2+ | 1.436 |
| Li 1+ | 1.731 |
| Ca 2+ | 2 |

TABLE 1-continued (Cationic Field Strength based on Shannon-Prewitt Radii)

| Element | CFS: Z/r2 unit Å−2 |
|---|---|
| La 3+ | 2.817 |
| Ce(3) 3+ | 2.941 |
| Nd 3+ | 3.105 |
| Pm 3+ | 3.188 |
| Sm 3+ | 3.269 |
| Y 3+ | 3.704 |
| Mg 2+ | 3.858 |
| Pr 3+ | 4.152 |
| Ce(4) 4+ | 5.285 |
| Sc 3+ | 5.405 |
| Zr 4+ | 7.716 |
| Ga 3+ | 7.804 |
| Al 3+ | 10.481 |
| Ti(4) 4+ | 10.928 |
| Nb 5+ | 12.207 |
| Ta 5+ | 12.207 |
| Si 4+ | 25.000 |
| P 5+ | 34.600 |
| B 3+ | 41.152 |

Figure 3:
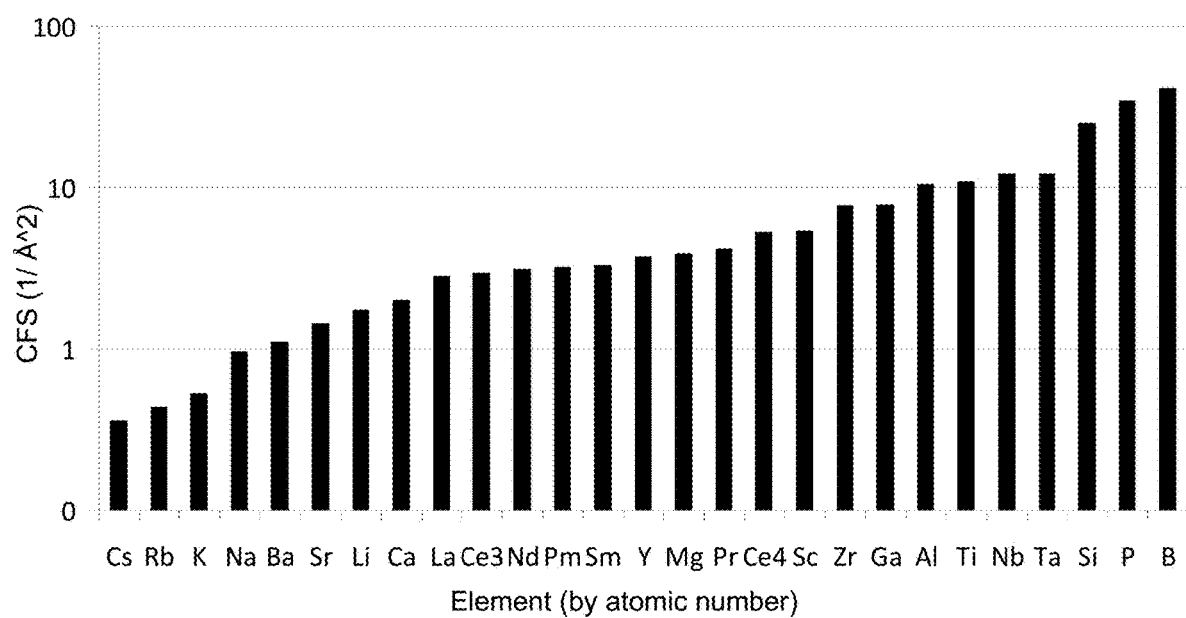
FIG. 3 is a schematic illustration of a variation in CFS as a function of atomic number, according to some embodiments.

FIG. 3 is a schematic illustration of a variation in CFS as a function of atomic number, according to some embodiments. In some cases, a modifier element may have a CFS that is at least 1 and not greater than 13 Å^−2, including at least 2 and not greater than 5.5, such as below 5 Å^−2. In some cases, a modifier having a CFS greater than 10 Å^−2 may be chosen. In some cases, a modifier may have a CFS less than 10 Å^−2, including below 2 Å^−2. For some films, a modifier with a high CFS (e.g., above 3 Å^−2) may act as both a network former and a network modifier.

A modifier may comprise an element expected to enhance specific properties. For example, magnetic properties may be enhanced by incorporating Iron, Cobalt, and/or Nickel, particularly in combination with Neodymium, Boron, and/or Praseodymium. Lithium may be used in certain embodiments. Luminescent properties may be modified by one or more rare earth elements, such as Europium, Gadolinium, and Terbium.

Figure 4:
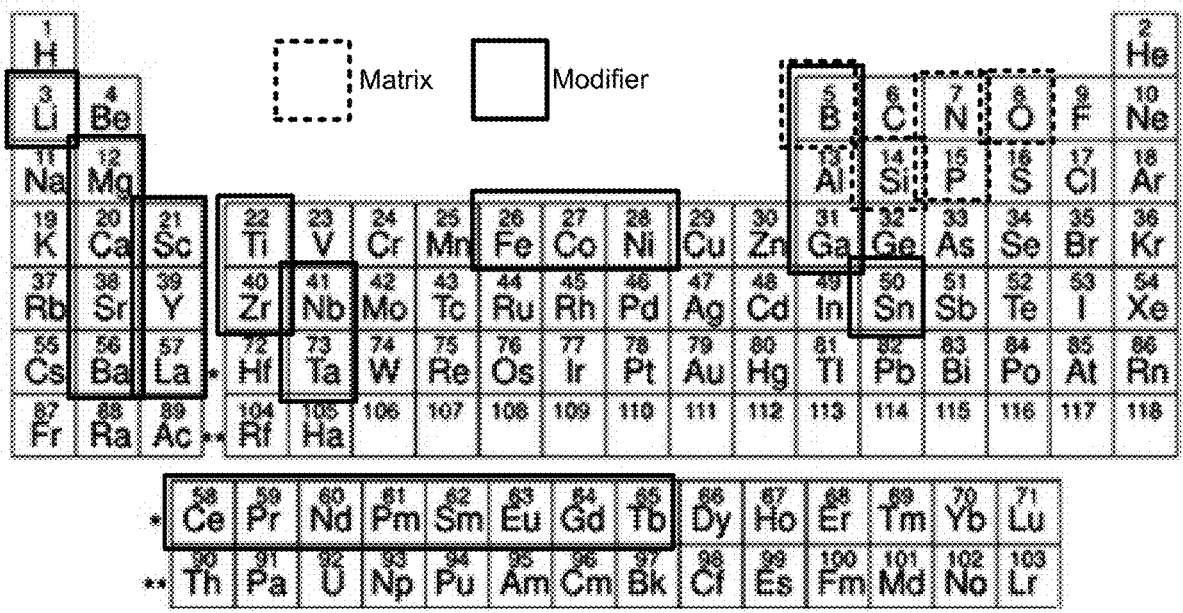
FIG. 4 illustrates a periodic table having a representative map of different categories of elements, according to certain embodiments.

FIG. 4 illustrates a periodic table having a representative map of different categories of elements, according to certain embodiments. A film may comprise one or more of Boron, Aluminum, Silicon, and Phosphorous, typically with at least one of, including both of, Oxygen and Nitrogen. In an embodiment, a film comprises at least one network forming element that tends to form amorphous phases (e.g., Boron, Silicon, Phosphorous), typically with Oxygen and/or Nitrogen. A film may comprise one or more network modifiers configured to modify a network (of network former/anion). A network modifier may reduce connectivity within the network (e.g., reducing Tg). Certain elements may behave as both network formers and network modifiers. An element in a first environment may behave as a network former, and in a second environment behave as a network modifier.

Film properties may be described using a variety of methods. Optical measurements such as absorption, transmittance, spectroscopy (e.g., FTIR and/or UV-Vis spectroscopy) and/or ellipsometry (e.g., spectroscopic ellipsometry) may be used to assess the effect of a variation in synthesis parameter on film properties. Nanoindentation may be used to characterize film properties. Normal force nanoindentation may be used to estimate hardness, modulus, toughness, and/or other parameters. In some cases, lateral motion may be used to measure wear resistance.

Figure 5:
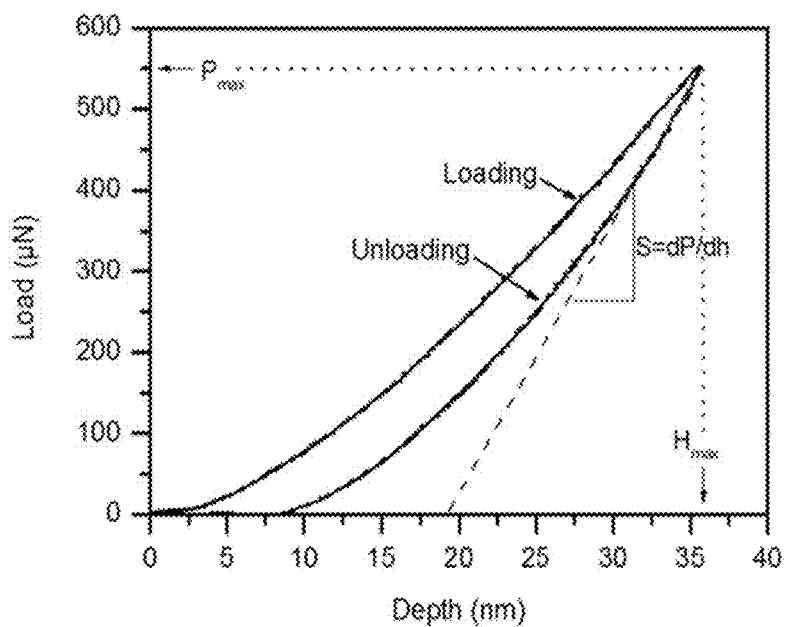
FIG. 5 illustrates a representative nanoindentation curve, according to some embodiments.

FIG. 5 illustrates a representative nanoindentation curve, according to some embodiments. Typically, plastic deformation of the film during indentation results in a difference between loading (indenting) and unloading (removal) of the indentor into the film. The unloading curve may be used to measure mechanical properties, particularly the initial portion of the unloading curve. A maximum load and maximum penetration depth may be chosen that (typically) allows for measurement of film properties independent of substrate properties (e.g., by keeping penetration depth substantially below film thickness). A slope dP/dH of the unloading curve may be used to estimate elastic properties of the film. In this example, loading and unloading curves are shown, illustrating load (P) vs. displacement (h), along with a schematic representation of unloading slope S=(dP/dh). Maximum load Pmax (in this case, about 180 ⊕ N) and maximum depth Hmax (in this case, about 51 nm) are shown. From these data, reduced modulus Er may be calculated:

$$1/E_r = (1-v_i^2)/E_i + (1-v_s^2)/E_s.$$

Using a value for Poisson's ratio of the indenter (0.07) indenter Ei=1140 GPa, and an estimate of Poisson's ratio of the film (0.28) reduced modulus Er may be calculated.

EXAMPLES

To illustrate exemplary relationships among synthesis conditions and film properties, examples are illustrated herein. These examples are not exhaustive, nor are they intended to be limiting. Certain examples illustrate the effect of using two different alkaline earth elements (Mg and Ca). While Magnesium and Calcium are both typically 2+ valence, and may behave similarly in some environments, their cationic field strengths are different (Ca=2, Mg=3.858). Examples herein illustrate, for some films, how changing the CFS of a modifier element may result in a wide range of film properties, notwithstanding that the modifiers have the same valence.

In these examples, films were deposited on commercial soda-lime silicate float glass substrates (4 mm thick), silica (SiO₂) wafers (1 mm thick) and sapphire (Al₂O₃) wafers (0.5 mm thick), from which 1 cm×1 cm coupons were used for sputter deposition and testing. Prior to deposition, the coupons were ultrasonically cleaned for successive five minute treatments in trichloroethylene, acetone, and ethanol, then blow dried in N2. The coupons were subsequently introduced into the growth chamber via a load-lock.

The sputtering targets had a diameter of 50 mm and thickness of 6.5 mm. In these examples, targets were Silicon (99.99%) Magnesium (99.95%) and/or Calcium (99.95%) obtained from Plasmaterials, Inc., Livermore, Calif., USA. Sputtering was performed in a ultra-high vacuum (UHV) deposition system with a typical base pressure below 1E-7 Torr (1.3E-5 Pa). The substrates were mounted on a rotating platform, at equidistant positions from the rotation axis, with a platform rotation speed of 20 rpm to ensure uniformity. The target to substrate distance was 130 mm.

In these examples, the substrate temperature was maintained at 510° C. (e.g., just below the float glass transition temperature). The targets were clean-sputtered in Ar for 5 min before starting the deposition. Deposition times were up to approximately two hours.

X-ray diffraction (XRD) was performed using a Panalytical X'pert PRO MPD diffractometer with Cu kα radiation. A light microscope (Olympus PMG3, Japan) equipped with a digital camera was used to observe the surface morphology of the samples. Some of the samples were examined by energy dispersive X-ray (EDX) point analysis to determine the qualitative concentration of cations (Mg, and Si) and anions (O2 and N2), using LINK AN10000 and LINK INCA scanning electron microscope systems, operated at acceleration voltages of 15 and 7 kV.

The surface chemical composition of certain thin films was analyzed with X-ray photoelectron spectroscopy (XPS) technique. XPS analyses were performed with Axis Ultra DLD instrument from Kratos Analytical (UK) using monochromatic Al Kα radiation (hω =1486.6 eV) following sample sputter-cleaning with 0.5 keV Ar$^+$ ions incident at an angle of 70° with respect to the surface normal. Mg 2p, Si 2p, C 1s, O 1s and N 1s core-level XPS spectra were obtained from a 0.3×0.7 mm$^2$ area at the center of the sputter-cleaned region. Elemental concentrations were derived using CasaXPS software employing Shirley-type background and manufacturer's sensitivity factors.

Mechanical properties, including, hardness H and reduced elastic modulus $E_r$, of the thin films were measured by nano-indentation using a Triboindenter Ti 950 instrument (Hysitron, Inc., Eden Prairie, Minn., USA). A Berkovich diamond tip with total included angle of 142.3° and a half angle of 65.35° was used, with indentation load of 1 mN, and penetration depth not exceeding 10% of the film thickness. The Berkovich diamond tip was calibrated on a fused-silica sample. Each sample was measured twelve times to get a statistically valid average value. Hardness (H) and elastic modulus (Er) were calculated by the method of Oliver and Pharr using the unloading elastic portion of the load-displacement curve. (see, e.g., W. C. Oliver et al.: Measurement of hardness and elastic modulus by instrumented indentation, J. Mater. Res., Vol. 19, No. 1, (2004), incorporated by reference herein)

Mueller matrix spectroscopic ellipsometry (MMSE) was used to study the optical properties (e.g., refractive index $n_r$ and extinction coefficient K) of the films. The measurements were performed by using a Mueller matrix ellipsometer, the RC2®, from J. A. Woollam Co., Inc. (Lincoln, Nebr., USA). The samples were measured at four incident angles 45°, 55°, 65°, and 70°, and the full Mueller matrix was recorded in the wavelength range of 210-1690 nm. The data were analyzed with the software CompleteEASE, version 4.72, also from J.A. Woollam Co., Inc., and fitted with a Tauc-Lorentz model for amorphous films to assess their optical properties. Additional information regarding these examples may be found in the article "Novel transparent Mg—Si—O—N thin films with high hardness and refractive index," Vacuum 131 (2016) 1-4 and its associated cited references, which are incorporated by reference herein.

Compositions of certain examples, as determined by XPS, are summarized in the following Tables. Compositions are listed in atomic % and N equivalent % (e/o), X: Si, (X=O+N).

TABLE 2 float glass (soda lime silica) substrate, Si target power 100 watts, 50 mm diameter (5.1 watts/cm^2), 40 sccm total, Ar = 31.4 sccm, N2 = 8 sccm, O2 = 0.6 sccm)

Mg target

| ID | Power density (w/cm^2) | Composition (atomic %) | N + O (%) | N/ (N + O) (%) | Mg/ (Mg + Si) (%) | Thick. (nm) | Rough. (nm) |
|---|---|---|---|---|---|---|---|
| M4  | 2.0 | $Mg_{12}Si_{30}O_{29}N_{29}$ | 58 | 50 | 29 | 372 | 4.63 |
| M6  | 3.1 | $Mg_{15}Si_{30}O_{19}N_{35}$ | 54 | 65 | 33 | 418 | 6.93 |
| M8  | 4.1 | $Mg_{17}Si_{29}O_{17}N_{37}$ | 54 | 68 | 36 | 442 | 8.63 |
| M10 | 5.1 | $Mg_{17}Si_{29}O_{14}N_{40}$ | 54 | 74 | 36 | 449 | 8.82 |
| M12 | 6.1 | $Mg_{17}Si_{30}O_{11}N_{44}$ | 55 | 80 | 37 | 461 | 8.83 |
| M14 | 7.1 | $Mg_{19}Si_{23}O_{27}N_{31}$ | 58 | 53 | 45 | 463 | 9.35 |

TABLE 3

| ID | Mg/Si ratio | N/O ratio | Mg (e/o) | N (e/o) | O + N:Si |
|---|---|---|---|---|---|
| M4  | 0.40 | 0.98 | 16.75 | 59.41 | 1.91 |
| M6  | 0.50 | 1.81 | 19.81 | 73.05 | 1.80 |
| M8  | 0.57 | 2.19 | 22.14 | 76.62 | 1.86 |
| M10 | 0.57 | 2.80 | 22.14 | 80.75 | 1.83 |
| M12 | 0.57 | 3.87 | 22.17 | 85.29 | 1.80 |
| M14 | 0.81 | 1.15 | 28.88 | 63.24 | 2.52 |

Comp. properties. M = Magnesium, # = target power/10 (50 mm diameter target).

TABLE 4

(Mg film properties, on float glass), Thickness, Roughness, Hardness H, reduced Elastic modulus Er, refractive index at 633 nm $n_r$, extinction coefficient at 233 nm K, and band gap E)

| ID | Thick. (nm) | Rough. (nm) | H (GPa) | $E_r$ (GPa) | $n_r$ @633 nm | K @233 nm | E (eV) |
|---|---|---|---|---|---|---|---|
| M4 | 372.06 | 4.63 | 18.33 | 145.8 | 1.870 | 0.022282 | 4.490 |
| M6 | 417.87 | 6.93 | 18.09 | 150.7 | 1.896 | 0.033214 | 4.313 |
| M8 | 441.56 | 8.63 | 18.89 | 152.6 | 1.922 | 0.055692 | 4.074 |
| M10 | 448.86 | 8.82 | 17.87 | 131.2 | 1.948 | 0.070858 | 4.019 |
| M12 | 460.62 | 8.83 | 18.09 | 138.3 | 1.953 | 0.087010 | 4.112 |
| M14 | 462.53 | 9.35 | 20.55 | 166.2 | 1.994 | 0.0116623 | 3.725 |

TABLE 5

(Ca film synthesis, Si target power 100 watts, 50 mm diameter (5.1 watts/cm^2)
ID = C for Calcium, ## = target power/10, last number = Nitrogen %, Ca target = 50 mm diameter, total flow rate = 40 sccm)

| ID | Composition (atomic %) | Ca target power (W) | $N_2$ flow (%) | Ca/Si ratio | O/N ratio | Ca/ (Ca + Si) | N/ (N + O) | Ca eq. % | N eq. % |
|---|---|---|---|---|---|---|---|---|---|
| Series-N10, Ar = 35.4 sccm, N2 = 4 sccm, O2 = 0.6 sccm |||||||||||
| C06-1 | $Ca_{21}Si_{21}O_{51}N_{7.4}$ | 60 | 10 | 1.0 | 6.9 | 50.48 | 12.66 | 33.8 | 17.8 |
| C10-1 | $Ca_{26}Si_{11}O_{61}N_{2.4}$ | 100 | 10 | 2.3 | 25.5 | 69.86 | 3.79 | 53.7 | 5.5 |
| C14-1 | $Ca_{26}Si_{10}O_{63}N_{1.9}$ | 140 | 10 | 2.6 | 33.4 | 72.22 | 2.76 | 56.5 | 4.3 |
| Series-N20, Ar = 31.4 sccm, N2 = 8 sccm, O2 = 0.6 sccm |||||||||||
| C06-2 | $Ca_{17}Si_{21}O_{51}N_{11}$ | 60 | 20 | 0.8 | 04.7 | 45.09 | 17.33 | 29.1 | 24.1 |
| C10-2 | $Ca_{24}Si_{9.1}O_{64}N_{2.7}$ | 100 | 20 | 2.6 | 23.5 | 72.34 | 4.02 | 56.7 | 6.0 |
| C14-2 | $Ca_{28}Si_{9.6}O_{60}N_{2.6}$ | 140 | 20 | 2.9 | 23.2 | 74.12 | 4.16 | 58.9 | 6.1 |
| Series-N30, Ar = 27.4 sccm, N2 = 12 sccm, O2 = 0.6 sccm |||||||||||
| C06-3 | $Ca_{20}Si_{22}O_{45}N_{14}$ | 60 | 30 | 0.9 | 03.3 | 46.21 | 23.20 | 30.8 | 31.1 |
| C10-3 | $Ca_{25}Si_{11}O_{60}N_{3.4}$ | 100 | 30 | 2.3 | 17.8 | 69.33 | 5.31 | 53.0 | 7.8 |
| C14-3 | $Ca_{28}Si_{10}O_{60}N_{2.0}$ | 120 | 30 | 2.9 | 30.1 | 74.47 | 3.16 | 59.3 | 4.8 |

TABLE 6

(Ca film properties, H = hardness, Er = reduced elastic modulus, nr = refractive index, K = extinction coefficient, E = band gap)

| ID | Thick. (nm) | Rough. (nm) | H (GPa) | $E_r$ (GPa) | $n_r$ 633 nm | K 233 nm | E (eV) |
|---|---|---|---|---|---|---|---|
| C06-1 | 970 | 7.94 | 10.3 | 130 | 1.67 | 0.033 | 4.34 |
| C10-1* | — | — | 3.7 | 62 | — | — | — |
| C14-1* | — | — | 3.1 | 59 | — | — | — |
| C06-2 | 710 | 11.30 | 12.0 | 145 | 1.82 | 0.061 | 3.88 |
| C10-2 | 2144 | 2.98 | 3.2 | 63 | 1.58 | 0.012 | 3.50 |
| C14-2 | 2945 | 3.25 | 3.3 | 67 | 1.56 | 0.004 | 4.67 |
| C06-3 | 589 | 8.31 | 11.0 | 133 | 1.73 | 0.034 | 4.02 |
| C10-3* | — | — | 2.9 | 58 | — | — | — |
| C14-3 | 2601 | 2.33 | 3.2 | 65 | 1.56 | 0.001 | 4.86 |

Optical microscopy, AFM, and SEM were used to confirm film quality and morphology, including the absence of inclusions, phase separation, and other heterogeneities. The films appeared transparent.

Exemplary Embodiments

Figure 6A:
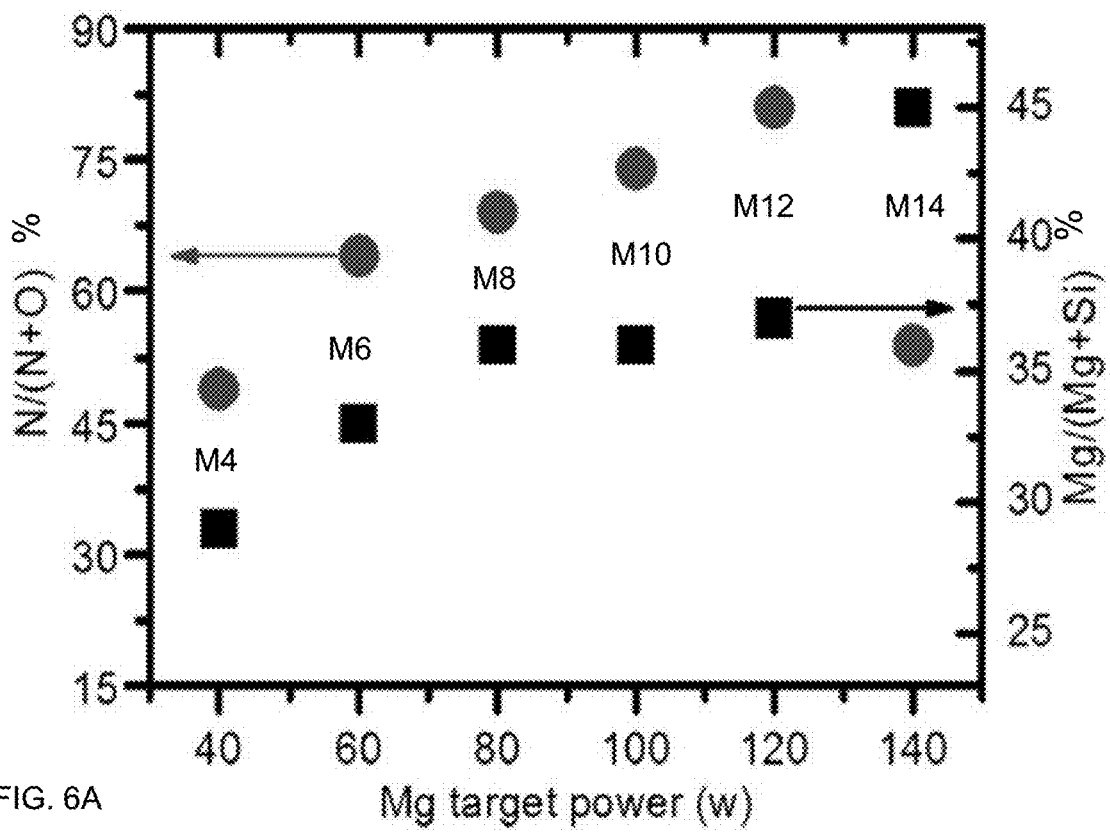
FIGS. 6A and 6B illustrate composition control, according to some embodiments.
Figure 6B:
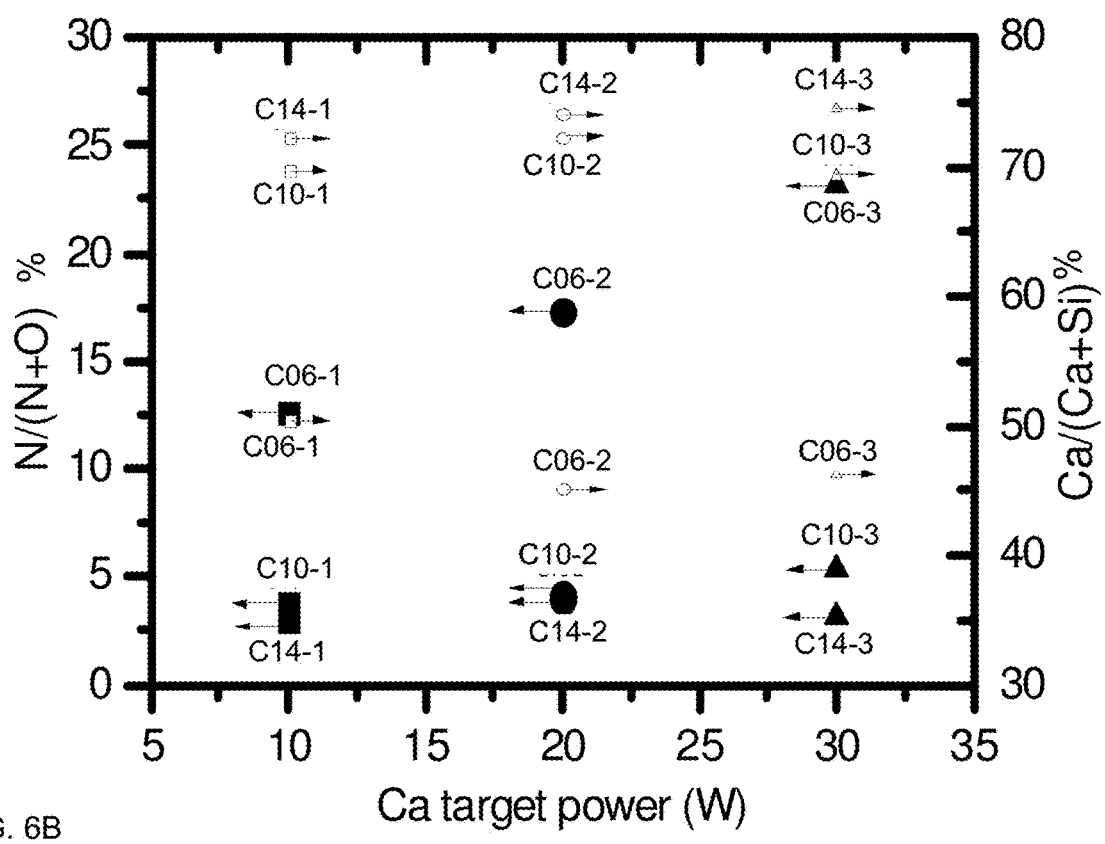

FIGS. 6A and 6B illustrate composition control, according to some embodiments. FIG. 6A illustrates exemplary values for the Magnesium system; FIG. 6B illustrates values for the Calcium system. Composition values are shown in atomic %. Target power may be used to control composition, with higher power generally resulting increased concentration. Complementing the corresponding compositions in Tables 2, 3, and 5, FIGS. 6A and 6B illustrate these compositions as ratios. For samples in the Mg system, the ratio of Nitrogen to (Nitrogen+Oxygen) was between about 45 and about 80 atomic %. The ratio of Magnesium to (Magnesium+Silicon) was between about 27 to about 48 atomic %. Several samples (M4-M6) had a ratio of Magnesium to (Magnesium+Silicon) that was from about 30 to 45%, and a ratio of Nitrogen to (Nitrogen+Oxygen) that was about 45-65%. Several samples (M8-M12) had a ratio of Magnesium to (Magnesium+Silicon) that was from about 35 to 38%, and a ratio of Nitrogen to (Nitrogen+Oxygen) that was about 60-80%. One sample (M14) had a ratio of Magnesium to (Magnesium+Silicon) that was about 45%, and a ratio of Nitrogen to (Nitrogen+Oxygen) that was about 37%. For the Calcium system, N/(N+O) varied from about 2-30%, and Ca/(Ca+Si) varied from about 30-80%.

Figure 7:
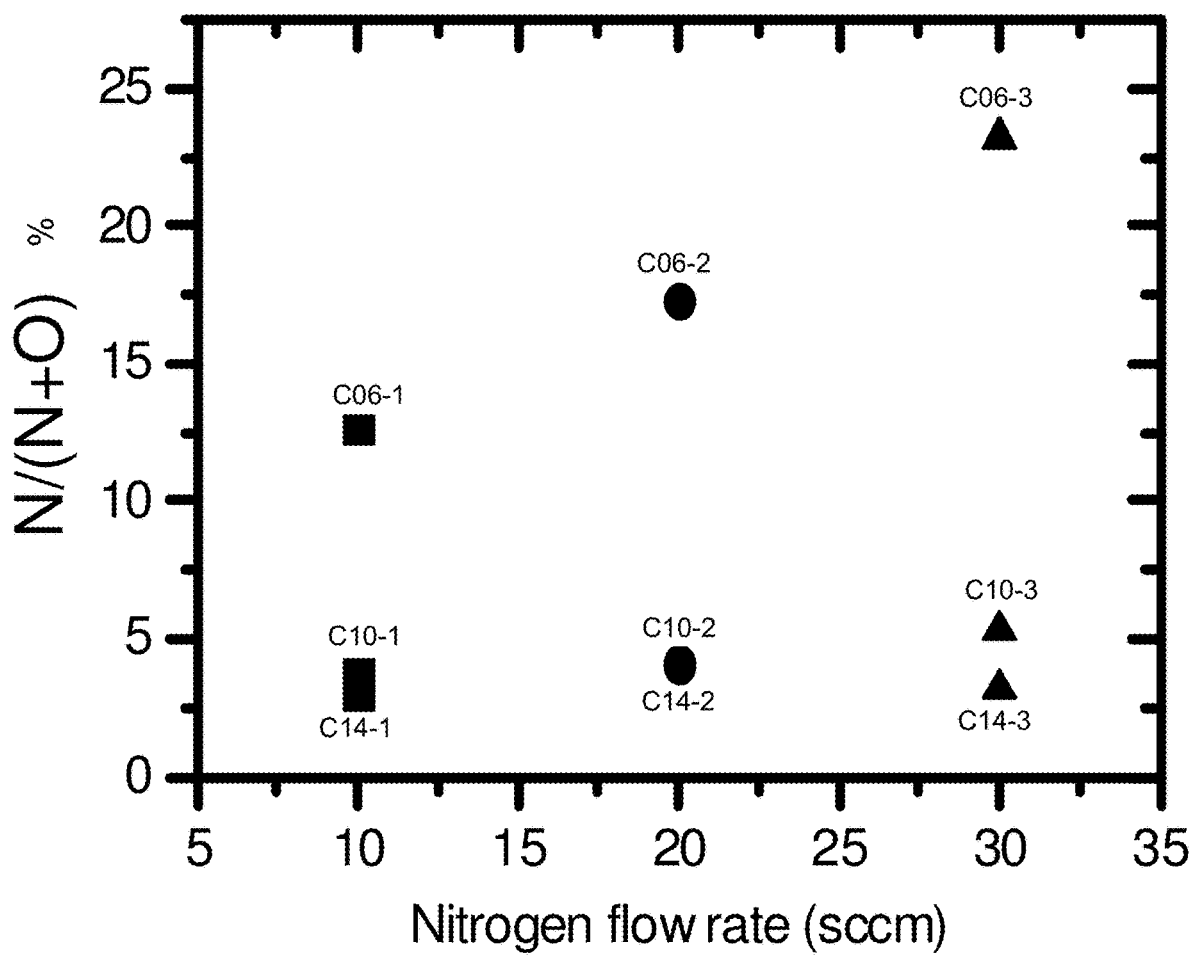
FIG. 7 illustrates an exemplary control of Nitrogen concentration with flow rate, according to some embodiments.

FIG. 7 illustrates an exemplary control of Nitrogen concentration with flow rate, according to some embodiments. In this example (modifier element=Calcium), increased Nitrogen flow generally resulted in increased Nitrogen concentration in the film. Sputtering (e.g., reactive sputtering) may be used to create films having much higher Nitrogen concentrations than is typically possible for bulk materials. Additionally, homogeneity may be maintained at concentrations that (in bulk) would likely result in phase separation.

Figure 8A:
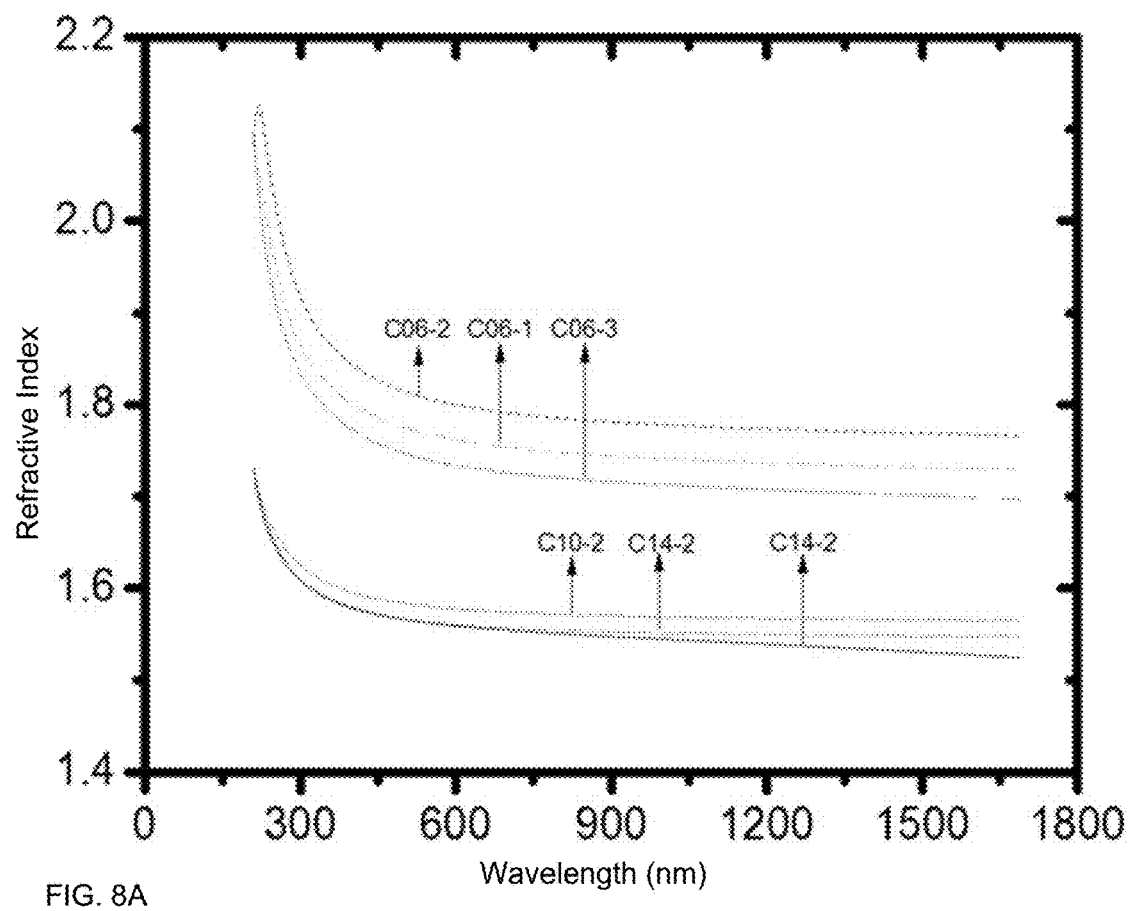
FIGS. 8A and 8B illustrate exemplary refractive index as a function of wavelength, according to some embodiments.
Figure 8B:
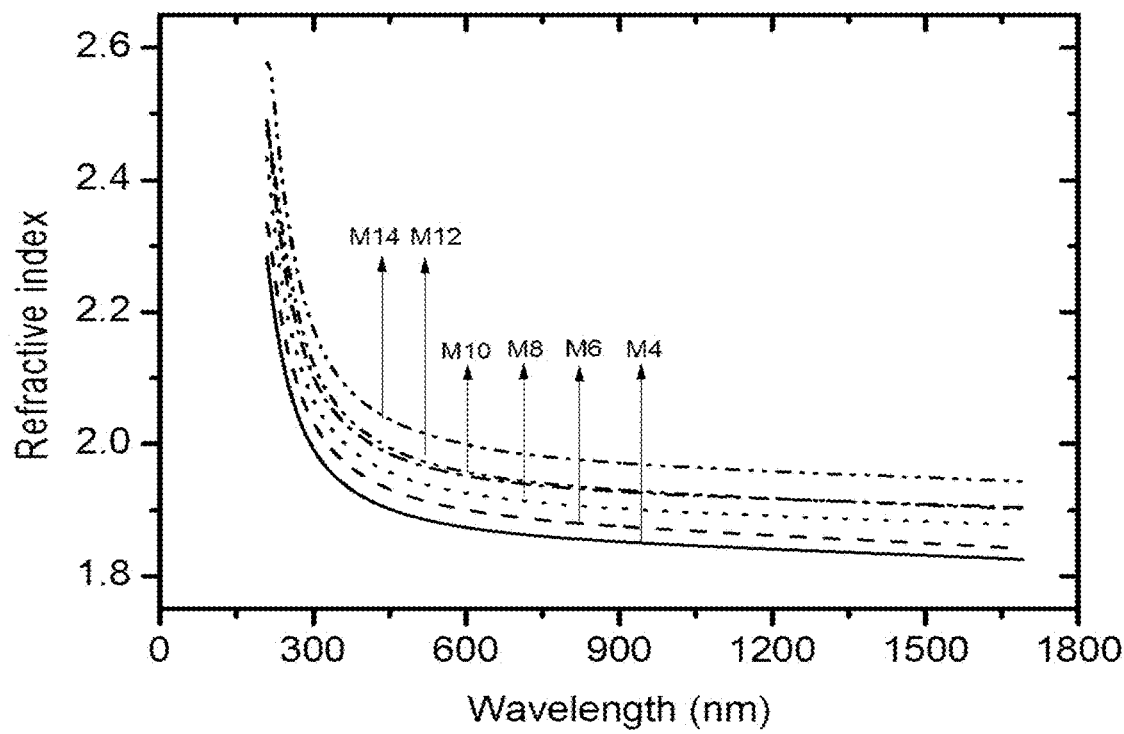

FIGS. 8A and 8B illustrate exemplary refractive index as a function of wavelength, according to some embodiments. Refractive index was generally below 2 for wavelengths above 700 nm. Refractive index may be greater than 1.8 for wavelengths between 300 and 1500 nm in some embodiments. For certain films a refractive index may be below 2 for wavelengths above about 450 nm. Refractive index may generally decrease monotonically with increasing wavelength, with Mg samples having a refractive index at 1650 nm between 1.85 and 1.95. For the Calcium samples, refractive index was generally below 1.9 at wavelengths above 450 nm. For certain samples, refractive index was generally between 1.7 and 1.8 at wavelengths above 450 nm. For certain samples, refractive index was generally between 1.55 and 1.6 for wavelengths above 450 nm.

Figure 9:
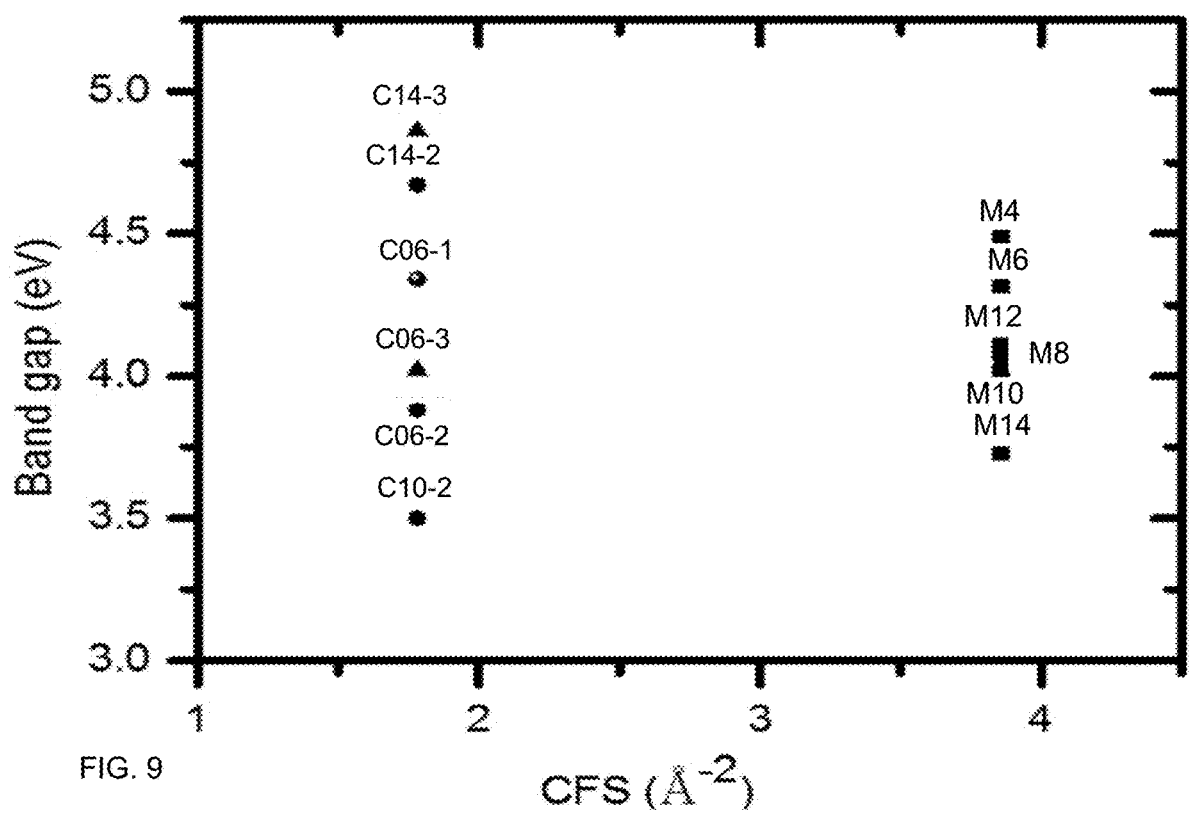
FIG. 9 illustrates an exemplary relationship between band gap and CFS, according to some embodiments.

FIG. 9 illustrates an exemplary relationship between band gap and CFS, according to some embodiments. While Mg and Ca have different values for CFS, band gap may be controlled independently of CFS for both systems.

Figure 10:
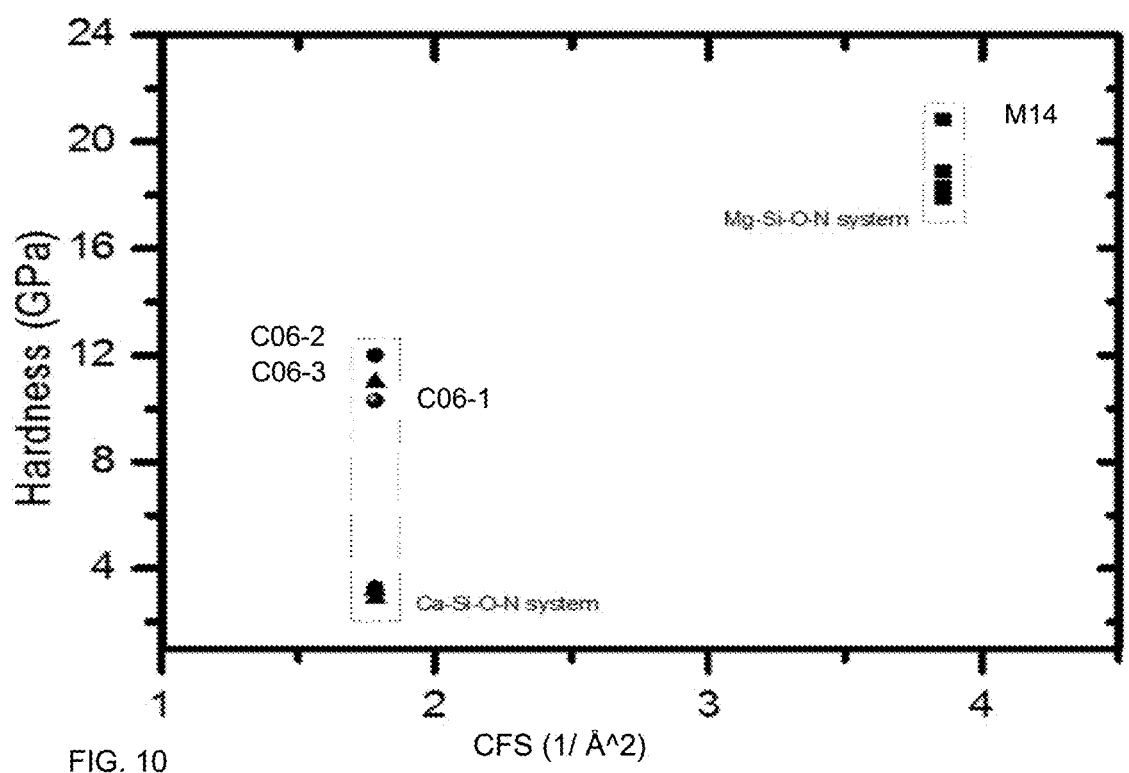
FIG. 10 illustrates an exemplary relationship between hardness and CFS, according to some embodiments.

FIG. 10 illustrates an exemplary relationship between hardness and CFS, according to some embodiments. Hardness may be engineered via modifier CFS in some systems. A modifier having a high CFS may increase hardness.

Figure 11:
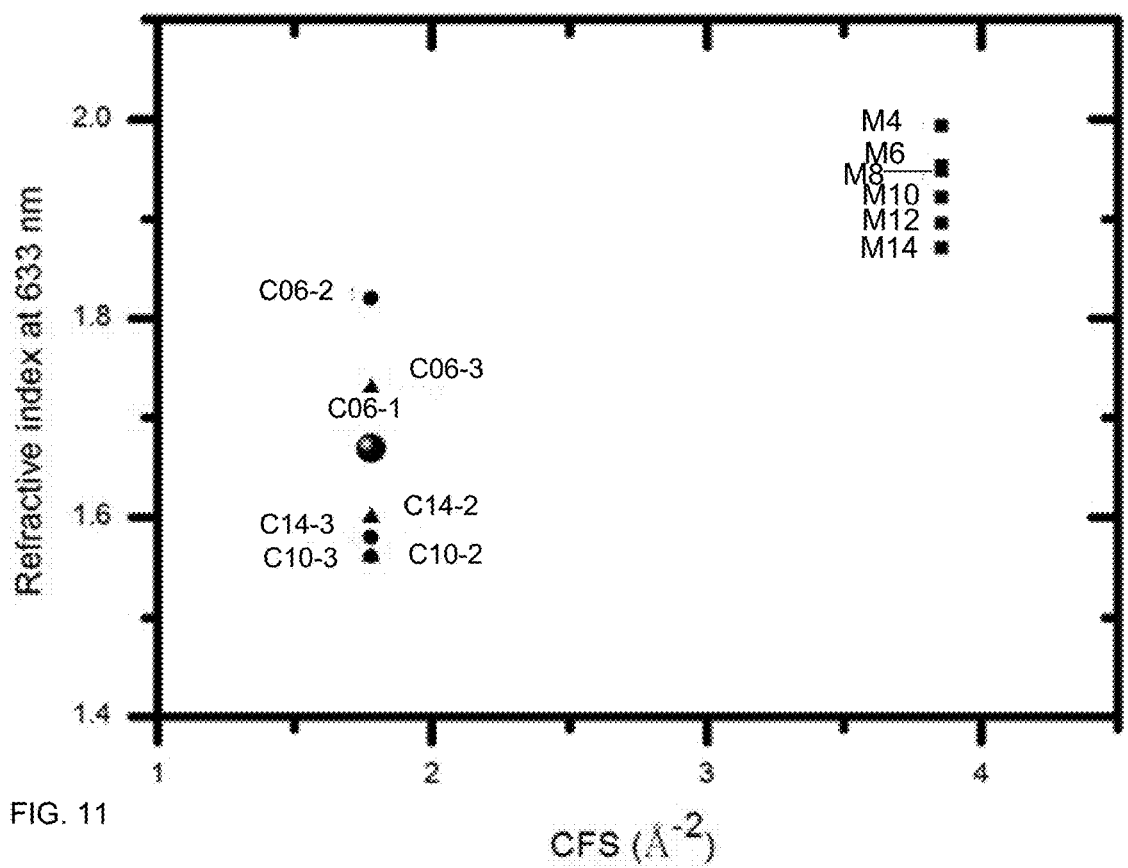
FIG. 11 illustrates an exemplary relationship between refractive index at 633 nm and CFS, according to some embodiments.

FIG. 11 illustrates an exemplary relationship between refractive index at 633 nm and CFS, according to some embodiments. CFS choice may be used to tailor refractive index. In these examples, samples with higher CFS generally had higher refractive indices.

Figure 12:
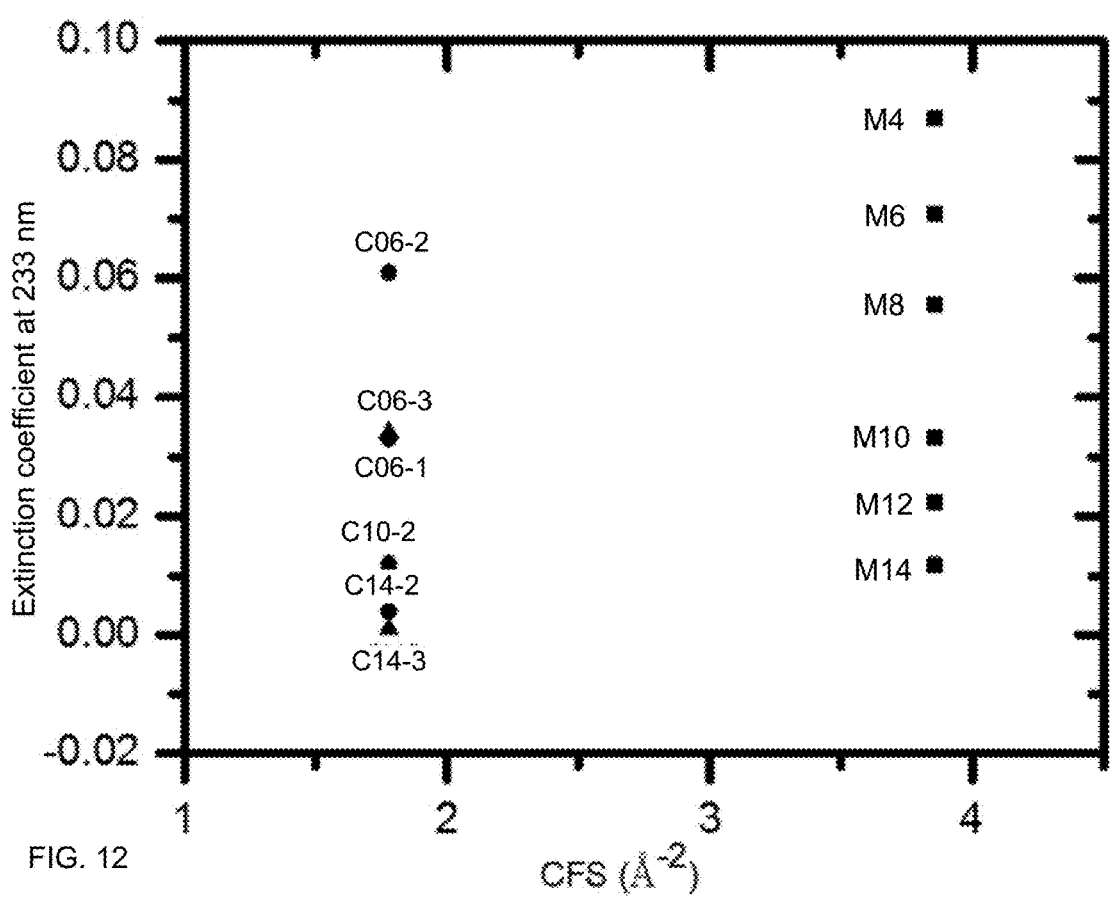
FIG. 12 illustrates an exemplary relationship between extinction coefficient at 233 nm and CFS, according to some embodiments.

FIG. 12 illustrates an exemplary relationship between extinction coefficient at 233 nm and CFS, according to some embodiments. A film may be substantially transparent in the visible regime (e.g., have an extinction coefficient that is virtually zero). An extinction coefficient in the ultraviolet may be used as an inverse measure of transparency in the ultraviolet, which may be a proxy for response to visible light. Samples may be engineered to have a range of extinction coefficients. In these samples, extinction coefficients at 233 nm were generally below 0.1, including below 0.05. A film may have an extinction coefficient at 233 nm that is below 0.02.

Figure 13A:
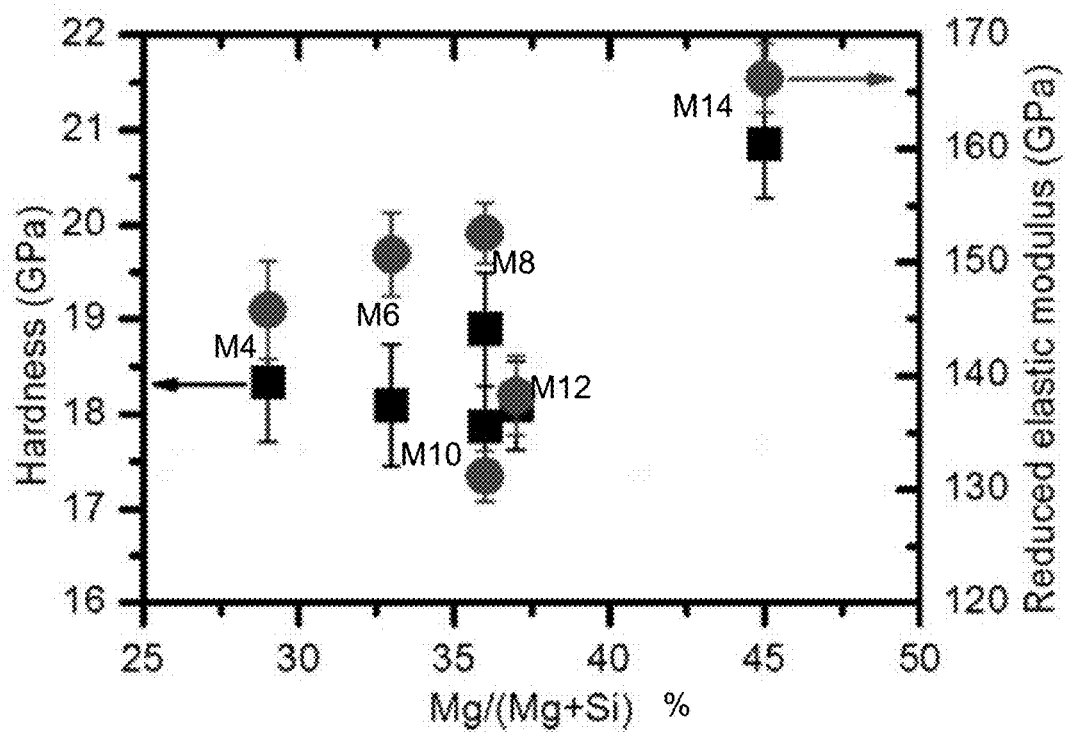
FIGS. 13A and 13B illustrate mechanical properties of films according to some embodiments.
Figure 13B:
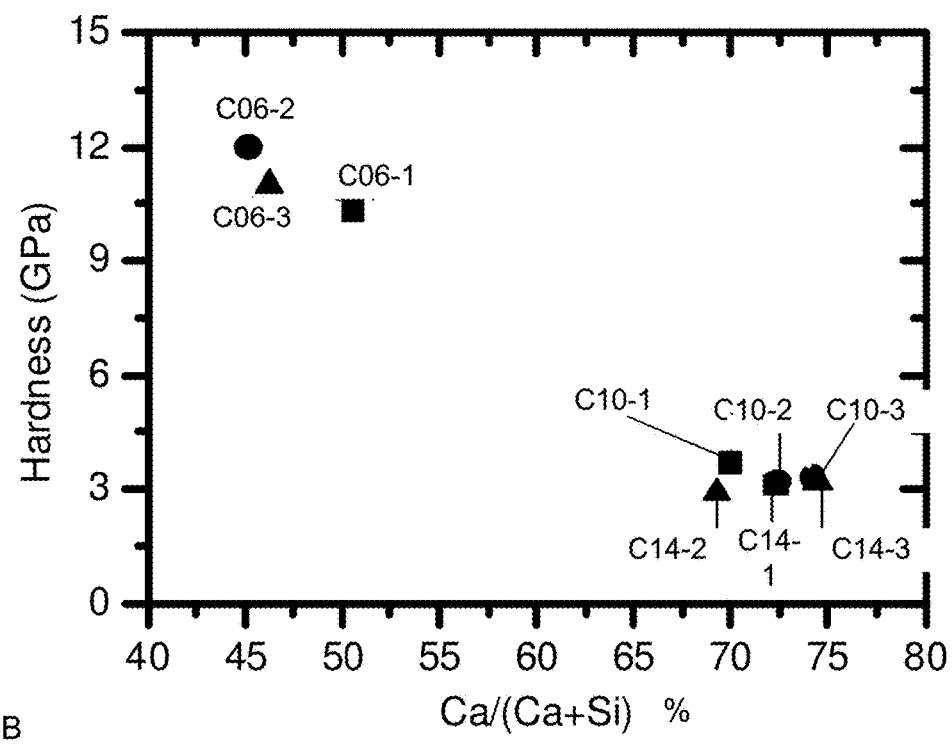

FIGS. 13A and 13B illustrate mechanical properties of films according to some embodiments. In some cases, mechanical properties may be controlled via CFS choice and/or modifier concentration. FIG. 13A illustrates exemplary hardness and reduced elastic modulus as a function of Mg/(Mg+Si) for the Magnesium system. FIG. 13B illustrates exemplary hardness for certain samples in the Calcium system. For the examples shown in FIG. 13A, hardness ranged from about 15 GPa to about 23 Gpa, generally increasing with Mg content. Reduced elastic modulus ranged from about 125 to about 170 Gpa. For the Calcium system (FIG. 13B), certain samples had hardness ranging from about 9-15 GPa, and certain samples had hardness ranging from about 2-6 GPa. By comparison, commercial float glass substrates were measured to have a hardness of about 7 Gpa.

Figure 14A:
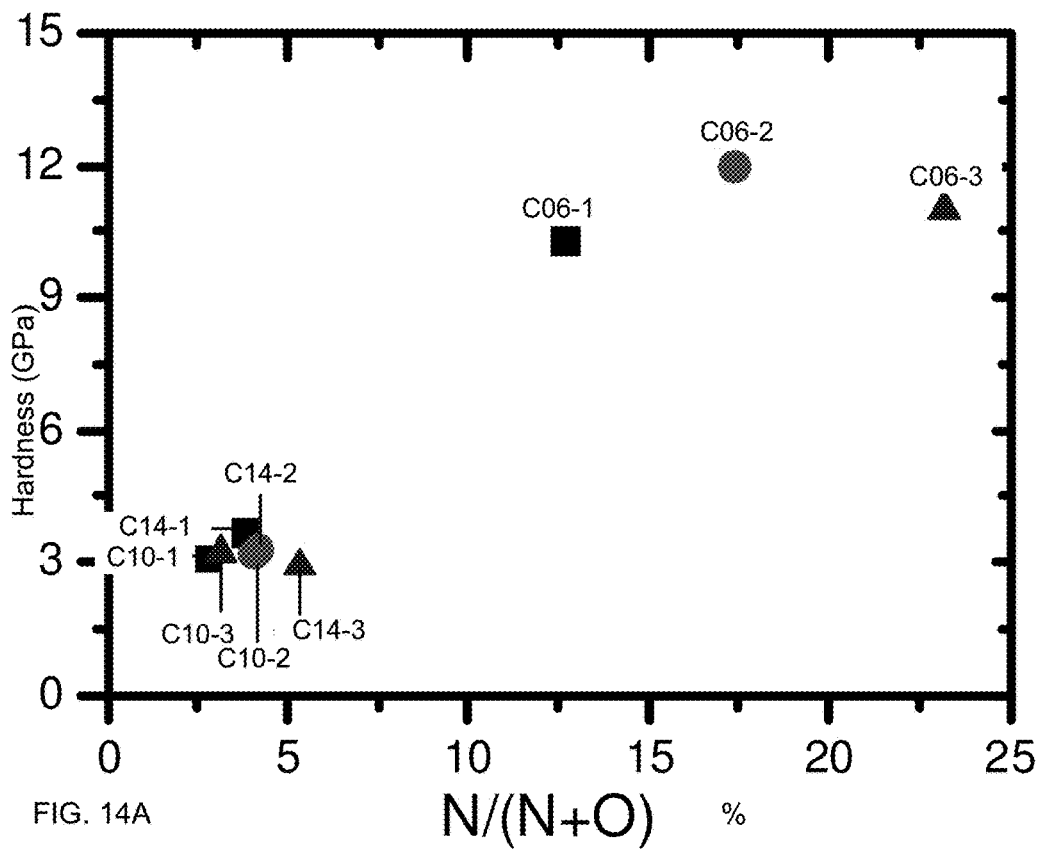
FIGS. 14A and 14B illustrate hardness as a function of Nitrogen content, according to some embodiments.
Figure 14B:
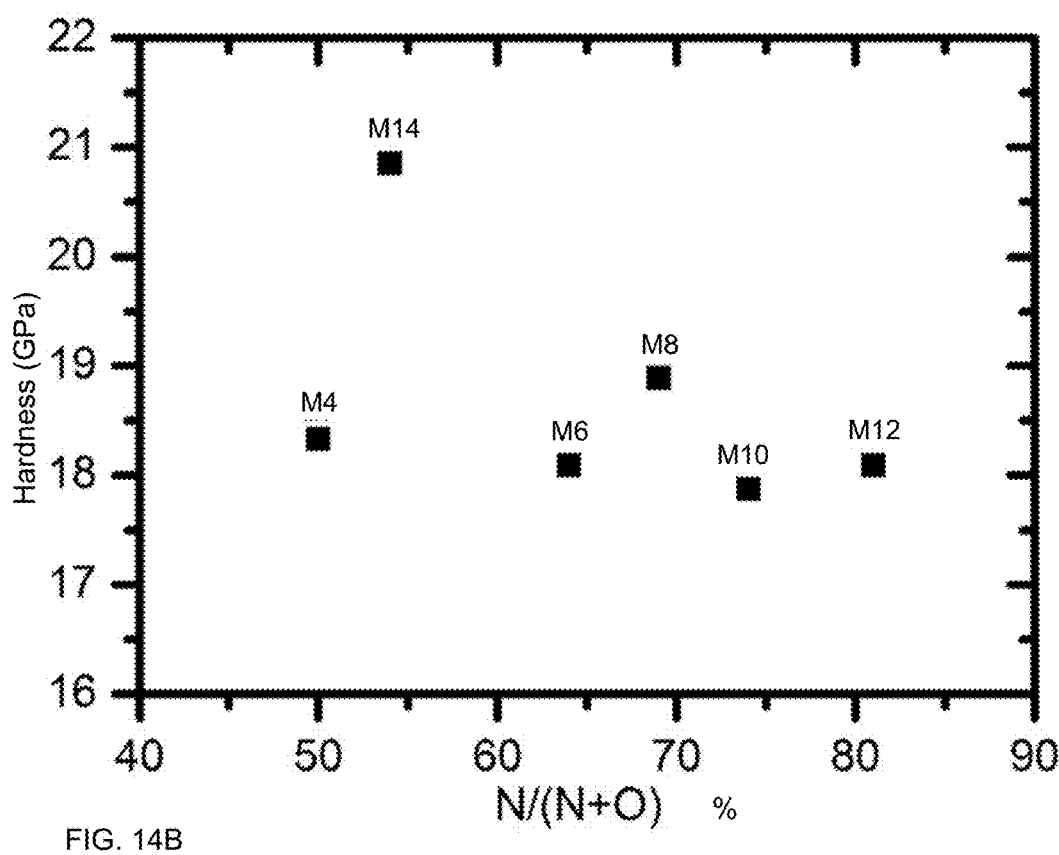

FIGS. 14A and 14B illustrate hardness as a function of Nitrogen content, according to some embodiments. For the Calcium samples (FIG. 14A), hardness generally increased with increasing N/(N+O). For the Magnesium samples (which generally had higher Nitrogen concentration) hardness decreased slightly with increasing Nitrogen concentration. For some films, hardness may be increased with increasing Nitrogen concentration.

Figure 15A:
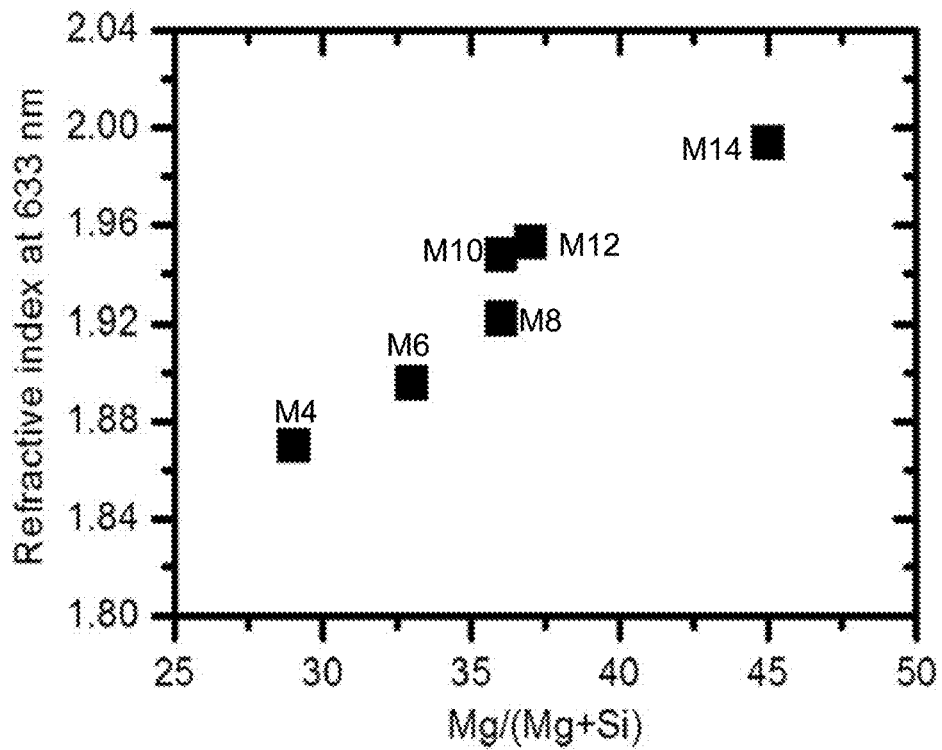
FIGS. 15A and 15B illustrate exemplary refractive index as a function of modifier concentration, according to some embodiments.
Figure 15B:
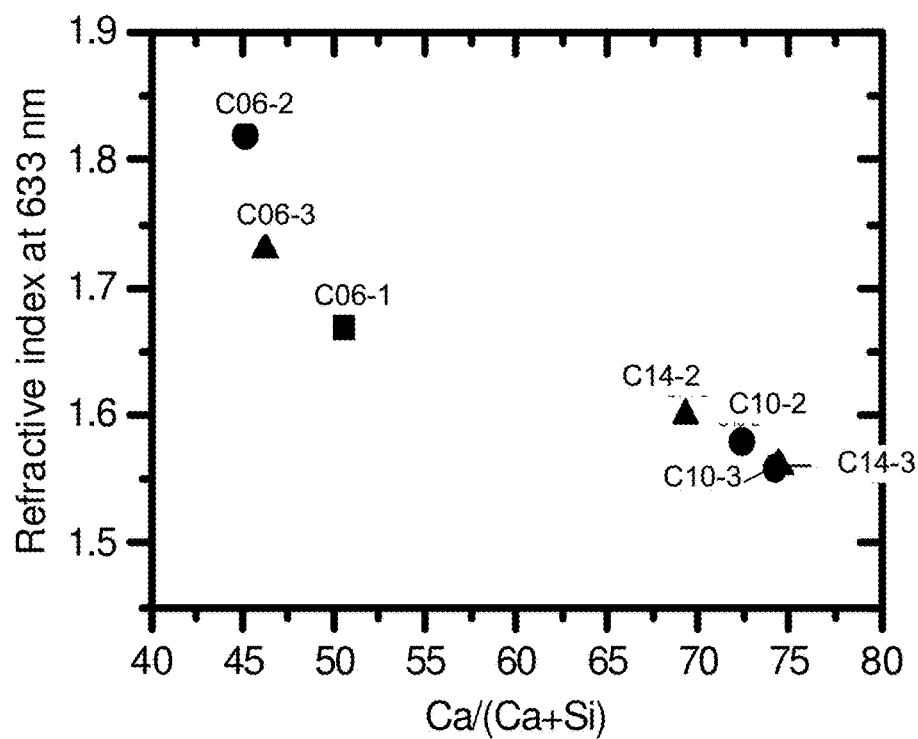

FIGS. 15A and 15B illustrate exemplary refractive index as a function of modifier concentration, according to some embodiments. Modifier CFS may be used to control refractive index in some films. A film having high refractive index may be advantageous for lens and/or optical filter applications. A film having a low refractive index may be advantageous for antireflective coating applications. In these examples, refractive indices at 633 nm are shown, generally ranging from about 1.84 to about 2 for the Magnesium system, and about 1.55 to 1.85 for the Calcium system. For the Magnesium system refractive index at 633 nm generally increased with increasing Magnesium content. For the Calcium system, refractive index at 633 nm generally decreased with increasing Calcium content.

Figure 16:
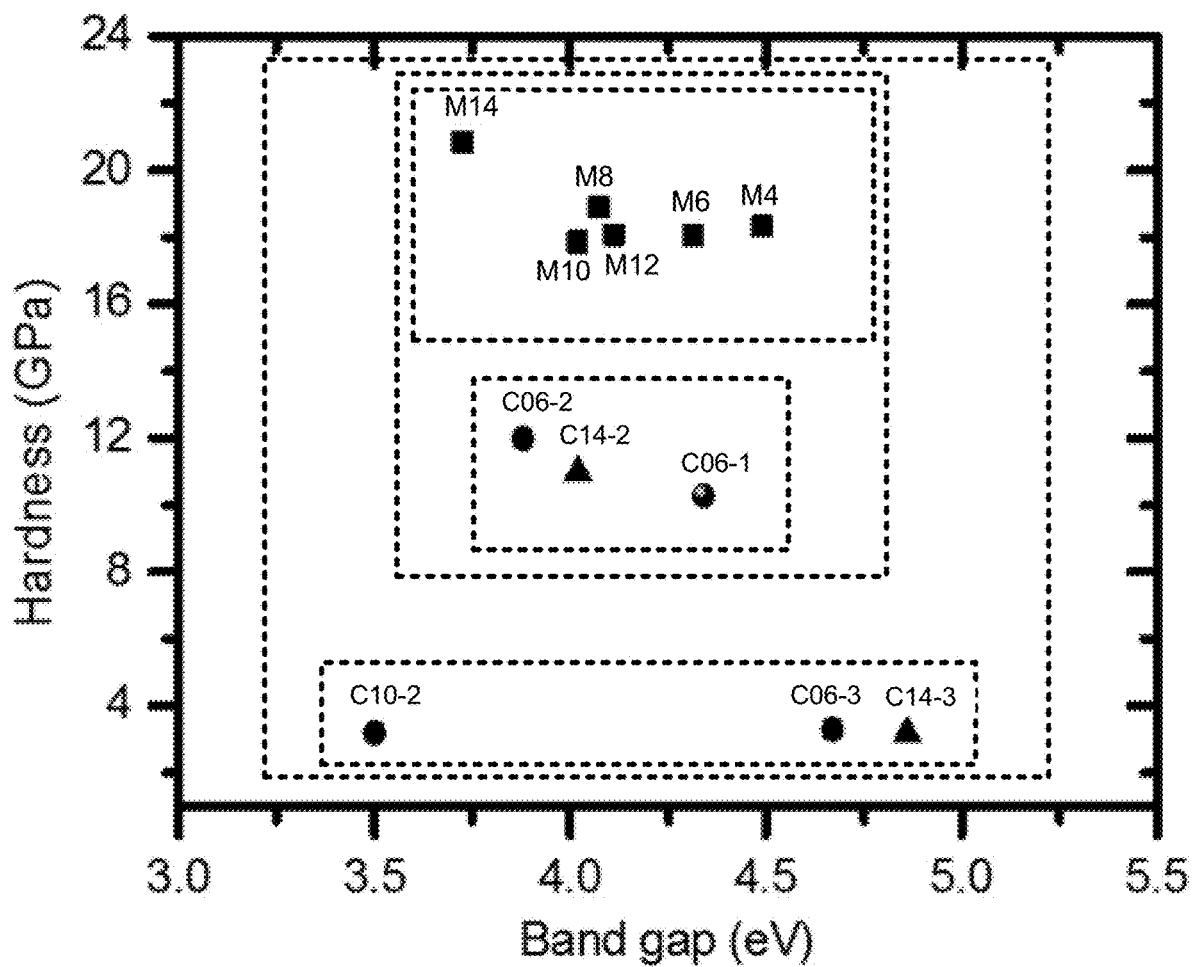
FIG. 16 illustrates an exemplary range of mechanical and optical properties, according to some embodiments.

FIG. 16 illustrates an exemplary range of mechanical and optical properties, according to some embodiments. CFS and/or concentration may be used to engineer a range of combinations of hardness and band gap. A film may have a hardness that is at least 2 GPa, including at least 8 GPa, including at least 14 GPa. A film may have a band gap that is at least 3 eV, including at least 3.5 eV. A film may have a band gap that does not exceed 5.5 eV, including below about 5 eV.

A film may have a hardness between about 2 and 6 GPa, and may have a band gap between about 3.25 and 5 eV. A film may have a hardness between about 8 and 14 GPa, and may have a band gap between about 3.6 and 4.6 eV. A film may have a hardness between about 14 GPa and about 24 GPa, and may have a band gap between about 3.25 and 4.75 eV.

Figure 17:
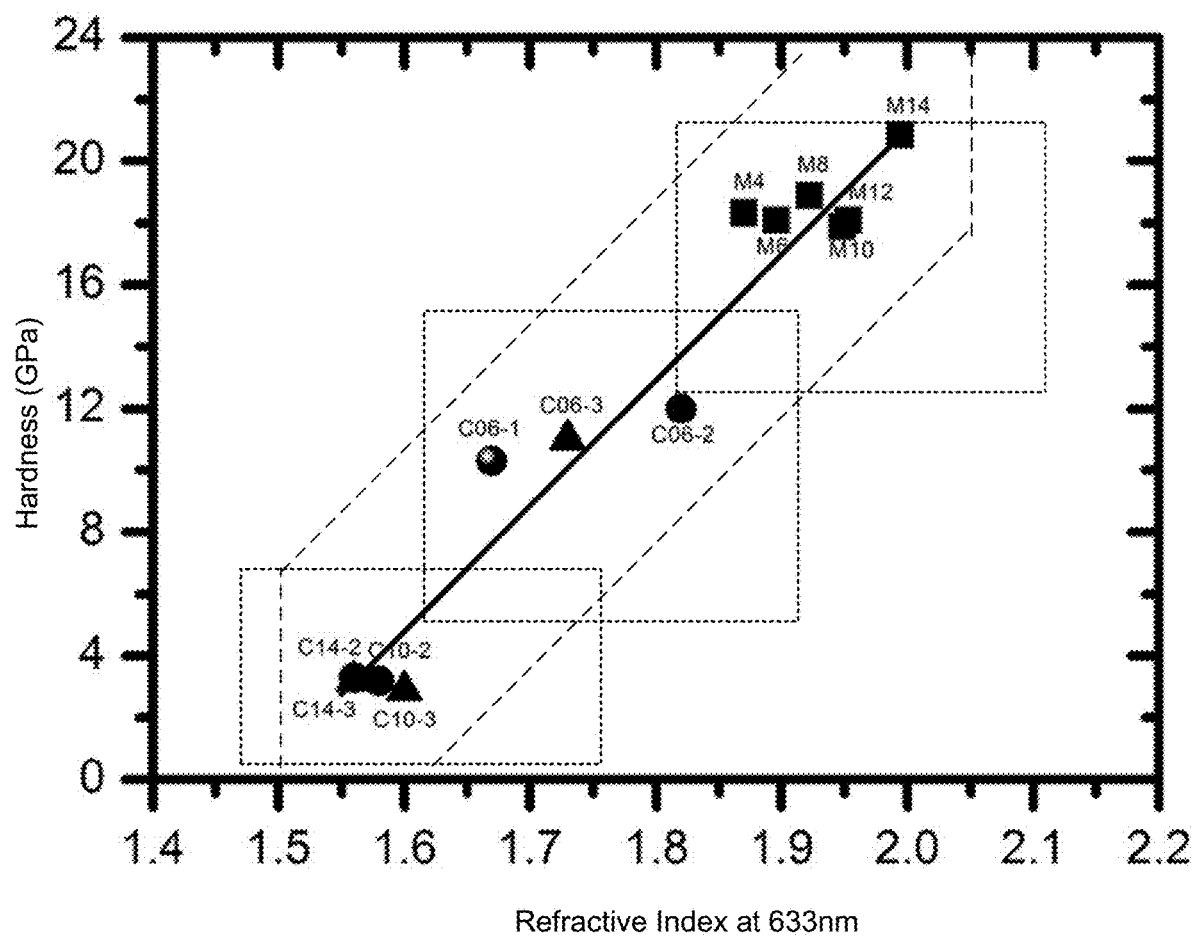
FIG. 17 illustrates an exemplary range of mechanical and optical properties, according to some embodiments.

FIG. 17 illustrates an exemplary range of mechanical and optical properties, according to some embodiments. CFS and/or concentration may be used to engineer a range of values of hardness and refractive index. A film may have a refractive index that is at least 1.45. A film may have a refractive index that does not exceed 2.1. A film may have a refractive index that is between about 1.45 and 1.75, and may have a hardness between about 2 and 6 GPa. A film may have a refractive index that is between about 1.6 and 1.9, and may have a hardness that is between about 6 and 16 GPa. A film may have a refractive index that is between about 1.8 and 2.1, and may have a hardness that is at least 12 GPa.

In some films, a relationship between hardness H (GPa) and refractive index RI is described by the equation $H = -61 + RI*41$. A film may have a combination of H and RI that satisfy this equation within a band of +/−6 GPa, including +/−4 GPa, including +/−2 GPa.

Figure 18:
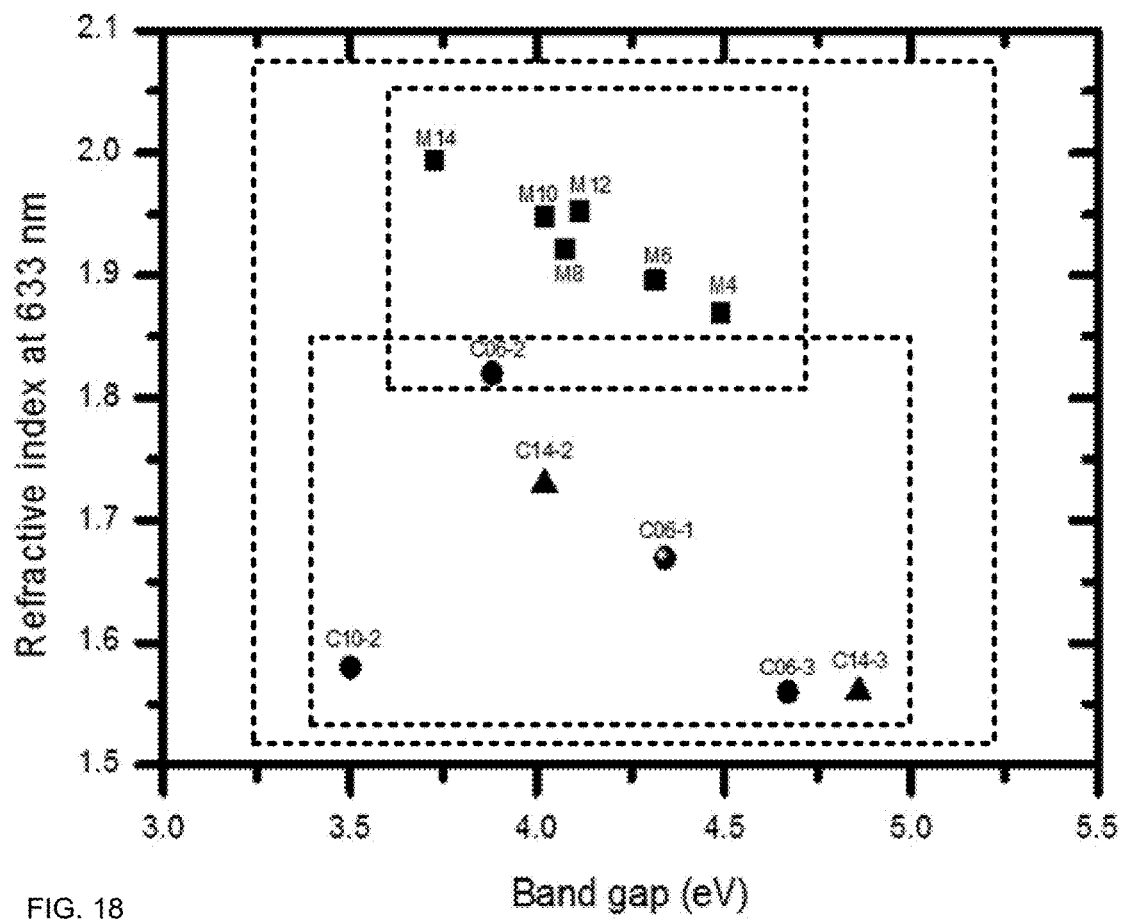
FIG. 18 illustrates an exemplary range of optical properties, according to some embodiments.

FIG. 18 illustrates an exemplary range of optical properties, according to some embodiments. CFS and/or concentration may be used to engineer a range of values of refractive index (in this example, at 633 nm) and band gap. A film may have a refractive index (633 nm) between about 1.5 and 2.1, and may have a band gap between about 3.25 and 5.25. A film may have a refractive index (633 nm) between about 1.55 and 1.85, and may have a band gap between about 3.4 and 5 eV. A film may have a refractive index (633 nm) between about 1.8 and 2.05 and may have a band gap between about 3.6 and 4.8 eV.

Figure 19A:
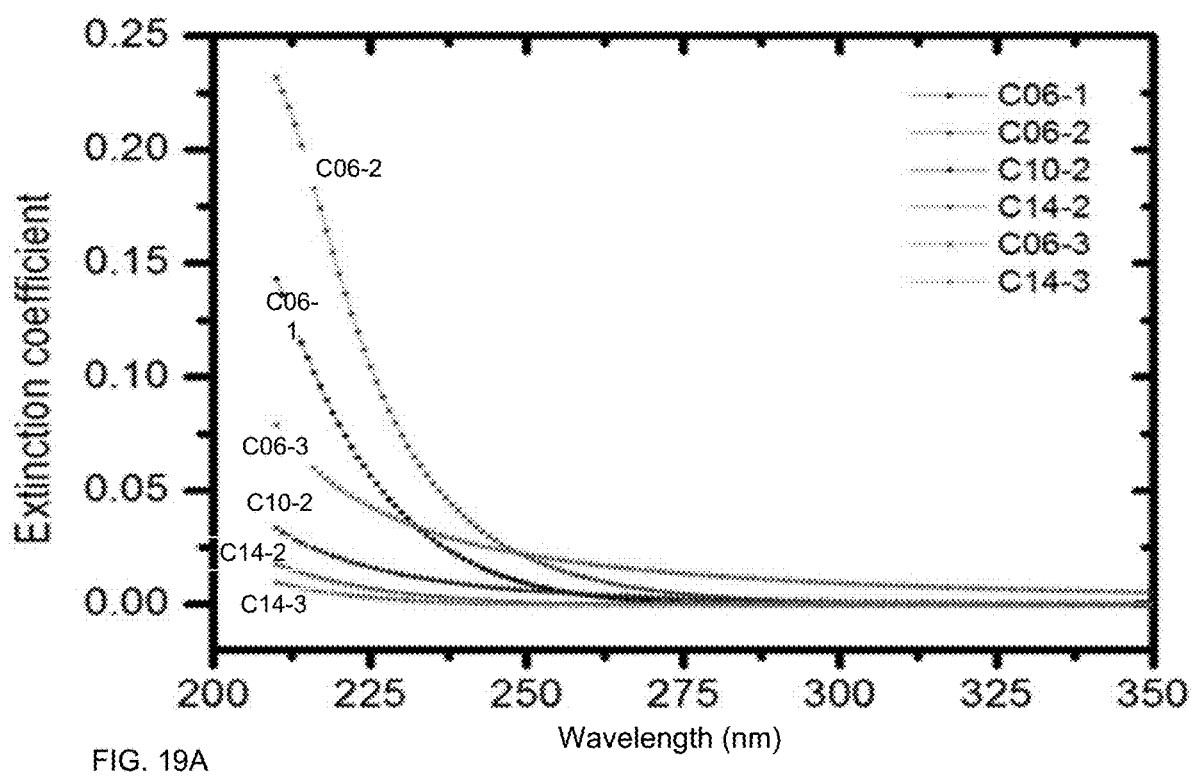
FIG. 19A illustrates an exemplary range of extinction coefficients between 200 and 350 nm, according to some embodiments.

FIG. 19A illustrates an exemplary range of extinction coefficients between 200 and 350 nm, according to some embodiments. These examples illustrate Calcium films. A film may have an extinction coefficient at 225 nm that does not exceed 0.15, including below 0.1, including below 0.03. A film may have an extinction coefficient at 250 nm that does not exceed 0.05, including below 0.04, including below 0.03.

Figure 19B:
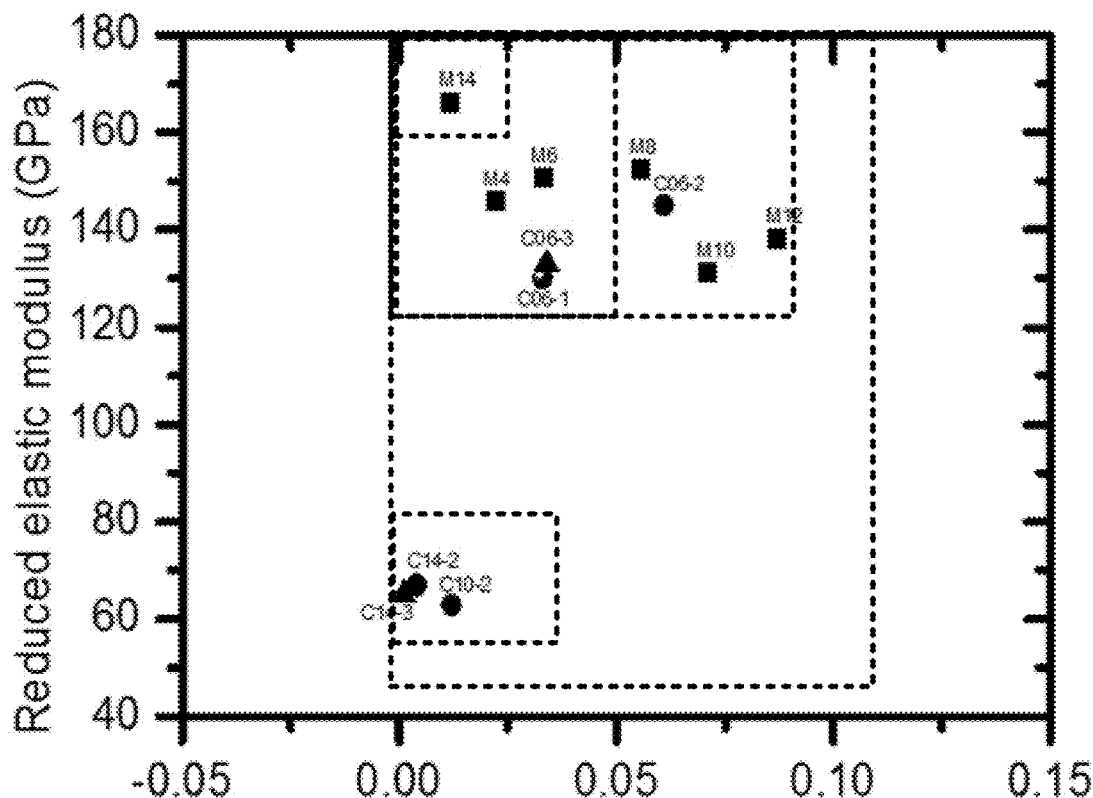
FIG. 19B illustrates an exemplary range of mechanical and optical properties, according to some embodiments.

FIG. 19B illustrates an exemplary range of mechanical and optical properties, according to some embodiments. CFS and/or concentration may be used to engineer a range of values of reduced elastic modulus and extinction coefficient (in this case, at 233 nm). A film may have an extinction coefficient at 233 nm that does not exceed 0.15, including below about 0.12, including below about 0.10, and may have a reduced elastic modulus that is at least 50 GPa, including at least 120 GPa. A film may have a reduced elastic modulus that does not exceed 200 GPa, including below 180 GPa.

A film may have an extinction coefficient at 233 nm that does not exceed 0.025, including below 0.015, including below 0.01, including below 0.005, including below 0.002. A film may have a reduced elastic modulus that is at least 50 GPa, and may be up to 100 GPa, including below about 80 GPa. In a particular embodiment, a film has a hardness that is at least 2 GPa and an extinction coefficient at 233 nm that does not exceed 0.003.

A film may have an extinction coefficient at 233 nm that is below 0.05, including below 0.03, including below 0.02, and may have a reduced elastic modulus that is at least 140 GPa, including at least 160 GPa.

Figure 20:
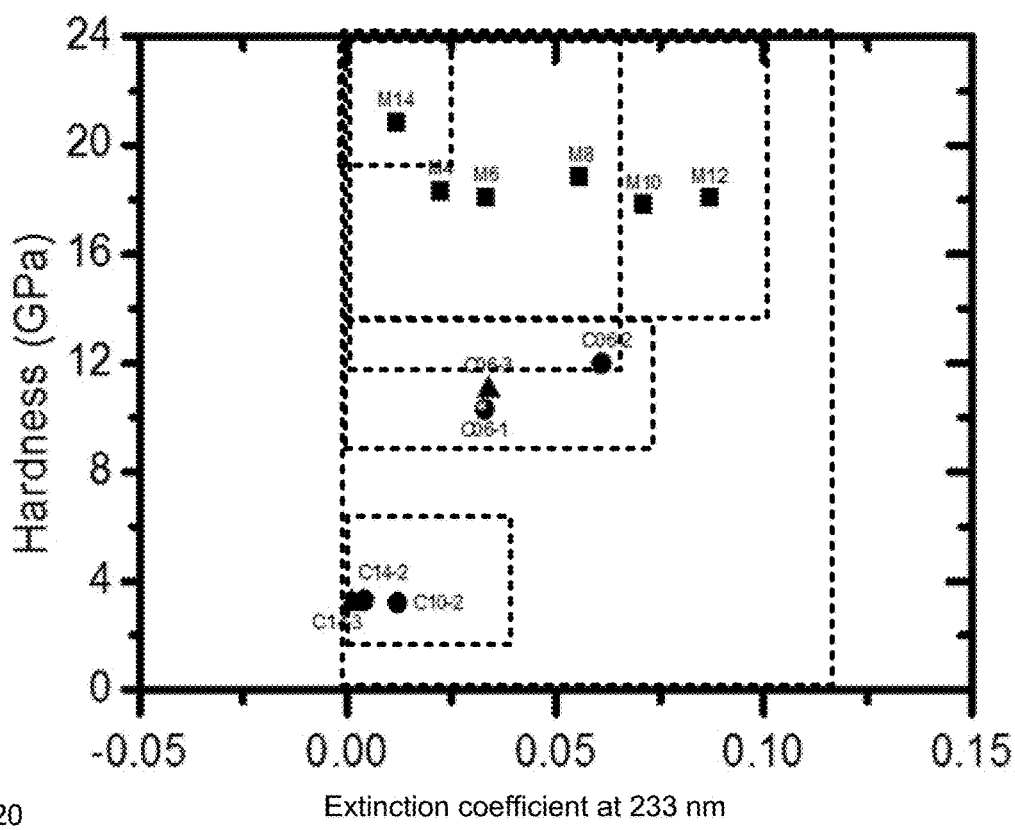
FIG. 20 illustrates an exemplary range of mechanical and optical properties, according to some embodiments.

FIG. 20 illustrates an exemplary range of mechanical and optical properties, according to some embodiments. CFS and/or concentration may be used to engineer a range of values of hardness and extinction coefficient (in this case, at 233 nm). A film may comprise a high hardness and a low extinction coefficient (e.g., an extinction coefficient in the visible regime that is substantially zero). A film may have an extinction coefficient at 233 nm that does not exceed 0.15, including does not exceed 0.12, including below about 0.1, including below about 0.08, including below about 0.05. A film may have an extinction coefficient at 233 nm that does not exceed 0.025, including below about 0.015, including below about 0.01, including below about 0.005. A film may have an extinction coefficient at 233 nm that does not exceed 0.02 and a hardness that is at least 16 GPa. A film may have an extinction coefficient at 233 nm that does not exceed 0.07 and a hardness that is at least 12 GPa.

By using one or more modifiers to modify a matrix based on network formers such as Silicon, Boron, and/or Phosphorous and anions such as Nitrogen and Oxygen, a range of properties may be created. Thin film deposition methods such as reactive sputtering may be used to create compositions and microstructures that result in an advantageous combination of mechanical, optical, and/or chemical properties. Hardness, refractive index, band gap, extinction coefficient, and other properties may be optimized by a suitable modifier choice and concentration.

Cationic field strength (CFS) of a modifier may have a significant effect on film properties. Even for cations having the same valence (e.g., both Ca and Mg are typically 2+) variation in CFS may result in different and heretofore unexpected film properties. In some cases, conflicting combinations of properties (e.g., high hardness and high band gap, and/or high modulus and high refractive index, and/or high hardness and low extinction coefficient) may be created via suitable CFS choice and concentration of various film components.

The above description is illustrative and not restrictive. Many variations of the invention will become apparent to those of skill in the art upon review of this disclosure. An explicit combination of features disclosed herein does not preclude the removal of any of these features from the combination. That an explicit combination is not recited herein does not preclude the combination of those features. The scope of the invention should, therefore, be determined not with reference to the above description, but instead should be determined with reference to the appended claims along with their full scope of equivalents.

What is claimed is:

1. A thin film comprising, in atomic %:
   at least one of Silicon, Phosphorous, and Boron in an amount that is at least 4% and not greater than 60%;
   Nitrogen in an amount that is at least 10% and not greater than 70%;
   Oxygen in an amount that is at least 3% and not greater than 60%; and
   at least one modifier element comprising one or more of Magnesium, Calcium, Strontium, and Barium, and having a cationic field strength that is at least 2 and not greater than 5.5 Å$^{-2}$, the at least one modifier element present in an amount that is at least 5% and not greater than 45%,
   wherein the thin film is amorphous, homogenous and at least partially optically transparent, and wherein:
   the film has a hardness that is at least 2 GPa, and
   a band gap that is at least 3 eV.

2. The film of claim 1, wherein the at least one modifier element comprises at least one of Calcium, Strontium, and Barium.

3. The film of claim 1, wherein the at least one modifier element further comprises at least one of Yttrium, Praseodymium, Cerium, Scandium, Neodymium, and Lanthanum.

4. The film of claim 1, wherein:
   the film has a hardness that is between 2 and 16 GPa.

5. The film of claim 1, wherein:
   the film has a hardness that is at least 2 GPa, and
   a refractive index at 633 nm that is not greater than 1.85.

6. The film of claim 1, wherein:
   the film has a band gap that is at least 3.25 eV, and
   a refractive index at 633 nm that is not greater than 1.85.

7. The film of claim 1, wherein the film has an extinction coefficient at 233 nm that does not exceed 0.01.

8. The film of claim 1, in atomic %:
   an amount of the at least one of Silicon, Phosphorous, and Boron is at least 10% and not greater than 50%;
   an amount of the Nitrogen is at least 15% and not greater than 60%; and
   an amount of the Oxygen is at least 5% and not greater than 50%.

9. The film of claim 1, where in the film has a nanoindentation hardness greater than 14 GPa.

10. The film of claim 1, wherein the film has a refractive index at 633 nm that is at least 1.8.

11. The film of claim 9, wherein the film has a band gap that is at least 3 eV.

12. The film of claim 1, wherein, in atomic %:
    the at least one of Silicon, Phosphorous, and Boron comprises Silicon in an amount that is at least 18% and at most 35%;
    the Nitrogen is in an amount that is at least 26% and at most 49%
    the Oxygen is in an amount that is at least 6% and at most 34%; and
    the at least one modifier element in an amount that is at least 7% and at most 40%, and the at least one modifier element comprises Magnesium.

13. The film of claim 12, wherein:
    the Silicon is at least 20% and not greater than 33%;
    the Nitrogen is at least 28% and not greater than 47%;
    the Oxygen is at least 8% and not greater than 30%; and
    the at least one modifier element comprises Magnesium in an amount that is at least 14% and not greater than 30%.

14. The film of claim 13, wherein:
    the Silicon is not greater than 26%;
    the Nitrogen is not greater than 34%
    the Oxygen is at least 24%; and
    the Magnesium is at least 15% and not greater than 26%.

15. The film of claim 1, wherein a ratio of Nitrogen to (Nitrogen+Oxygen) is at least 0.4.

16. The film of claim 3, wherein:
    the at least one modifier element comprises at least one of an alkaline earth element and a rare earth element;
    a ratio of Nitrogen to (Nitrogen+Oxygen) is between 0.4 and 0.86; and
    a ratio of an amount of the at least one of the alkaline earth element and the rare earth element to an aggregate amount of (the element+Silicon) is between 0.3 and 0.5.

17. The film of claim 1, wherein the film has:
a hardness that is at least 2 GPa; and
an extinction coefficient at 233 nm that does not exceed 0.15.

18. The film of claim 15, wherein a ratio of Nitrogen to (Nitrogen+Oxygen) is not greater than 0.9.

19. A method for synthesizing a thin film, according to claim 1, the method comprising:
   providing a target comprising at least one of Silicon, Boron, and Phosphorous;
   providing a target comprising at least one modifier element selected from the group consisting of Magnesium, Calcium, Strontium, and Barium, and having a cationic field strength that is at least 2 and not greater than 5.5 $Å^{-2}$;
   disposing the targets in a deposition chamber;
   flowing an atmosphere comprising Nitrogen and Oxygen through the deposition chamber; and
   depositing a film onto a substrate by reactive Physical Vapor deposition, the film comprising Nitrogen, Oxygen, the at least one of Silicon, Boron, and Phosphorous, and the at least one modifier element.

20. The method of claim 19, wherein the deposition chamber is a vacuum chamber having a base pressure below 1E-5 torr.

* * * * *